(12) United States Patent
Cha et al.

(10) Patent No.: US 10,686,920 B2
(45) Date of Patent: Jun. 16, 2020

(54) MOBILE TERMINAL

(71) Applicant: LG ELECTRONICS INC., Seoul (KR)

(72) Inventors: Youngdo Cha, Seoul (KR); Hyunsu Song, Seoul (KR); Bonghyun Lee, Seoul (KR)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 16/327,446

(22) PCT Filed: Jan. 18, 2017

(86) PCT No.: PCT/KR2017/000624
§ 371 (c)(1),
(2) Date: Feb. 22, 2019

(87) PCT Pub. No.: WO2018/043844
PCT Pub. Date: Mar. 8, 2018

(65) Prior Publication Data
US 2019/0208043 A1    Jul. 4, 2019

(30) Foreign Application Priority Data

Aug. 30, 2016  (KR) .................. 10-2016-0111143
Nov. 4, 2016   (KR) .................. 10-2016-0146422

(51) Int. Cl.
*H04M 1/00* (2006.01)
*H04M 1/02* (2006.01)
(Continued)

(52) U.S. Cl.
CPC .......... *H04M 1/026* (2013.01); *G06F 1/1658* (2013.01); *G06K 9/00013* (2013.01); *H04M 1/02* (2013.01); *H05K 5/03* (2013.01); *H05K 5/061* (2013.01)

(58) Field of Classification Search
CPC combination set(s) only.
See application file for complete search history.

(56) References Cited

U.S. PATENT DOCUMENTS

| 2014/0124343 A1* | 5/2014 | Lee .................. H04M 1/026 200/302.2 |
| 2015/0245514 A1* | 8/2015 | Choung ............. G06K 9/00053 361/749 |
| 2017/0213068 A1* | 7/2017 | Chang ................ G06K 9/00053 |

FOREIGN PATENT DOCUMENTS

| JP | 2014-200024 A | 10/2014 |
| KR | 10-2012-0041609 A | 5/2012 |

(Continued)

*Primary Examiner* — Justin Y Lee
(74) *Attorney, Agent, or Firm* — Birch, Stewart, Kolasch & Birch, LLP

(57) ABSTRACT

Provided is a mobile terminal comprising: a case comprising a button hole; a main board mounted within the case; a button module which is exposed to the outside through the button hole; a sealing rubber comprising an opening into which the button module is inserted; a first waterproof tape in the form of a closed curve, which joins the sealing rubber and the button module; and a second waterproof tape in the form of a closed curve, which joins the sealing rubber and the case. The button module comprises: a fingerprint recognition module for recognizing a user's fingerprint when touched by a user's finger; a switch for generating a signal when pressed; and a flexible board comprising a mounting portion for mounting the fingerprint recognition module and the switch therein, a contact portion contacting the main board, and a connection portion for connecting the mounting portion and the contact portion.

19 Claims, 22 Drawing Sheets

(51) Int. Cl.
*G06K 9/00* (2006.01)
*G06F 1/16* (2006.01)
*H05K 5/03* (2006.01)
*H05K 5/06* (2006.01)

(56) References Cited

FOREIGN PATENT DOCUMENTS

| | | |
|---|---|---|
| KR | 10-2014-0009781 A | 1/2014 |
| KR | 10-2015-0099295 A | 8/2015 |
| KR | 10-2016-0028367 A | 3/2016 |

\* cited by examiner

MOBILE TERMINAL

CROSS REFERENCE TO RELATED APPLICATIONS

This application is the National Phase of PCT International Application No. PCT/KR2017/000624, filed on Jan. 18, 2017, which claims priority under 35 U.S.C. 119(a) to Patent Application Nos. 10-2016-0111143, filed in the Republic of Korea on Aug. 30, 2016 and 10-2016-0146422, filed in the Republic of Korea on Nov. 4, 2016, all of which are hereby expressly incorporated by reference into the present application.

TECHNICAL FIELD

The present disclosure relates to a mobile terminal, and more particularly, to a mobile terminal including a waterproof structure.

BACKGROUND ART

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

As a touch panel is added to a display unit of the mobile terminal, the display unit serves as an input unit as well as an output unit. In the mobile terminal, the display unit is used together with a button which generates a signal, when pressed with physical force.

The physical button is exposed to the outside through a button hole formed in a case, thereby introducing water between the button hole and the button. As a consequence, the waterproof performance of the button hole significantly affects the overall waterproof performance of the mobile terminal having a waterproof function.

DISCLOSURE

Technical Problem

An aspect of the present disclosure is to provide a mobile terminal with increased waterproof reliability between a button and a button hole.

Technical Solution

According to an embodiment of the present disclosure, a mobile terminal with a frame and a window disposed on a top surface of the frame includes a fingerprint recognition module, a home button having an accommodation space formed therein, in which the fingerprint recognition module is accommodated, and a sealing rubber sealing between the window and the home button. The home button may include an outer body portion surrounding the fingerprint recognition module, and a spacer formed in the outer body portion, and spacing the sealing rubber from the fingerprint recognition module. The sealing rubber may include a fixing portion disposed between the frame and the window, and a mounting portion extending from the fixing portion, and configured to mount the home button therein. A first adhesive member may be disposed between the fingerprint recognition module and the spacer, and a second adhesive member may be disposed between the mounting portion and the spacer.

The spacer may be formed along a periphery of the outer body portion.

The mounting portion may be formed along a periphery of the outer body portion.

The fingerprint recognition module may include a board portion and a touch portion disposed on the board portion and configured to touch a fingerprint. The first adhesive member may be disposed between the board portion and the spacer portion, a hole exposing a bottom surface of the board portion may be formed on the home button, and an opening facing the hole may be formed in the sealing rubber.

The mobile terminal may further include a dome switch under the board portion, and a flexible printed circuit board (FPCB) connecting the bottom surface of the board portion exposed through the hole and the opening to the dome switch.

A third adhesive member may be disposed between the fixing portion and the window.

According to another embodiment of the present disclosure, the mobile terminal may further include a second button positioned on one side of the home button. The sealing rubber may include a second mounting portion formed between the fixing portion and the mounting portion, and configured to mount the second button therein, and a fourth adhesive member may be disposed between the second mounting portion and the second button.

A second opening exposing a bottom of the second button may be formed on the sealing rubber, and the bottom of the second button exposed through the second opening may be connected to a second dome switch.

The mobile terminal may further include a third button positioned on the other side of the home button. The sealing rubber may include a third mounting portion formed between the fixing portion and the mounting portion, and configured to mount the third button therein, and a fifth adhesive member may be disposed between the third mounting portion and the third button.

A third opening exposing a bottom of the third button may be formed on the sealing rubber, and the bottom of the third button exposed through the third opening may be connected to a third dome switch.

According to another embodiment, a terminal includes a case including a button hole, a main board mounted inside the case, a button module exposed to an outside through the button hole, a sealing rubber including an opening configured to allow the button module to be inserted therethrough, a first waterproof tape in the form of a closed loop, configured to engage the sealing rubber with the button module, and a second waterproof tape in the form of a closed loop, configured to engage the sealing rubber with the case. The button module may include a fingerprint recognition module configured to recognize a user's fingerprint, when the fingerprint recognition module is touched by the user's finger, a switch configured to generate a signal, when pressed, and a flexible board including a mounting portion configured to mount the fingerprint recognition module and the switch thereon, a contact portion contacting the main board, and a connection portion connecting the mounting portion to the contact portion.

The fingerprint recognition module may be exposed to an outside through the button hole of the mobile terminal.

The fingerprint recognition module and the switch may be positioned on the same surface of the mounting portion, and the flexible board may be bent to superimpose the fingerprint recognition module and the switch over each other.

The flexible board may further include an extension portion extending outward from a periphery of the fingerprint recognition module, and the first waterproof tape may correspond to a shape of the extension portion, and may be engaged with the extension portion.

The button module may include a metal button frame having an accommodation space formed therein, in which the fingerprint recognition module is accommodated.

The mobile terminal may further include a reinforcement frame disposed inside the case, and a conductive gasket connecting between the button frame and the reinforcement frame.

The button frame may include an outer body portion surrounding the fingerprint recognition module, and contacting a periphery of the button hole, and a flange extending outward along an outer periphery of the outer body portion, and contacting an inside of the case.

The button frame may further include a spacer extending inward in the outer body portion, and supporting a periphery of a bottom surface of the fingerprint recognition module.

The mobile terminal may further include a button bracket mounted inside the case, and supporting the sealing rubber and the button module. A bracket tape fixing the sealing rubber and the button bracket to each other may be included. The bracket tape and the second waterproof tape may be disposed on opposite surfaces of the sealing rubber, opposing to each other.

The bracket tape may be in the form of an open curve with a part opened, to allow the connection portion of the flexible board to pass therethrough.

The sealing rubber may include a fixing portion engaged with the case by the second waterproof tape, an engagement portion extending from the fixing portion, and engaged with the button module by the first waterproof tape, and an elastic deformation portion disposed between the fixing portion and the engagement portion, and having a variable shape.

The fixing portion and the engagement portion of the sealing rubber may be flat, and the elastic deformation portion of the sealing rubber may have a curved surface.

The mobile terminal may further include a support disposed between the elastic deformation portion and the fixing portion, and supporting the sealing rubber to an internal structure of the mobile terminal.

Advantageous Effects

According to the present disclosure, as the gap between a flexible board and a waterproof member is removed in a button of a mobile terminal, intrusion of water into the mobile terminal can be prevented.

Further, with application of a new waterproof structure, a slimmer mobile terminal than a conventional one can be fabricated.

Further, since the new waterproof structure is formed of rubber, a stroke space can be secured for a home button in the mobile terminal.

Other objects and further scope of applicability of the present disclosure will become apparent from the detailed description given below. It is to be understood, however, that the detailed description and specific examples such as preferred embodiments of the disclosure are given by way of illustration only, since it is obvious to those skilled in the art that various changes and modifications can be made within the spirit and scope of the disclosure.

BEST MODE FOR CARRYING OUT THE INVENTION

Figure 1:
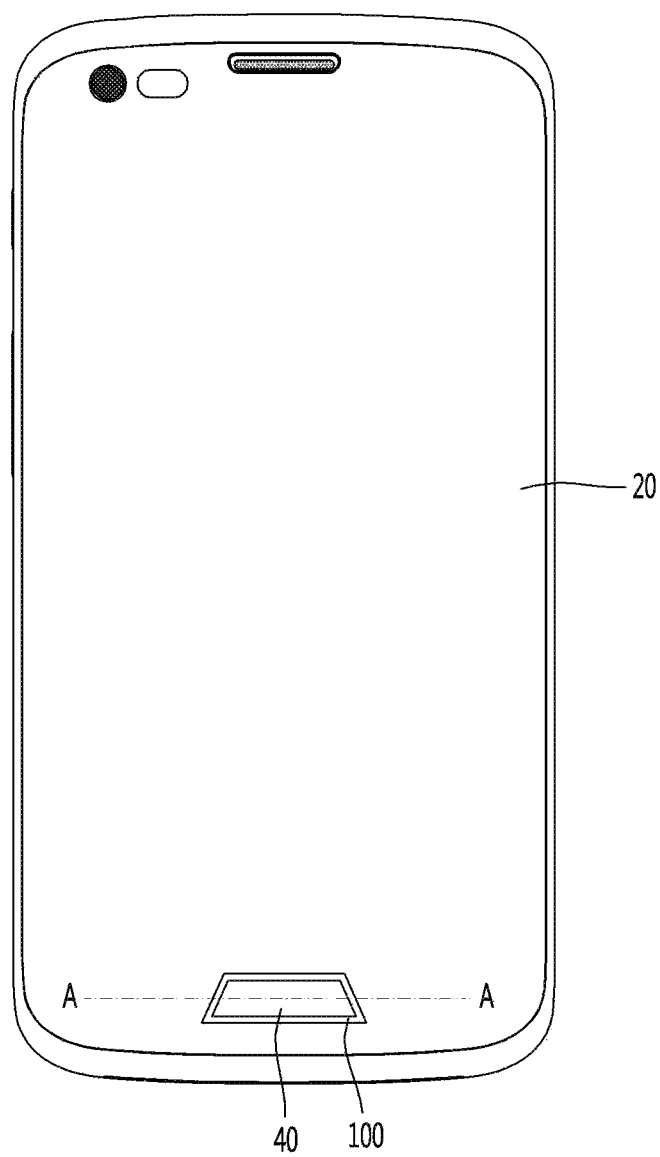
FIG. 1 is a front view illustrating a mobile terminal according to a first embodiment of the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 2:
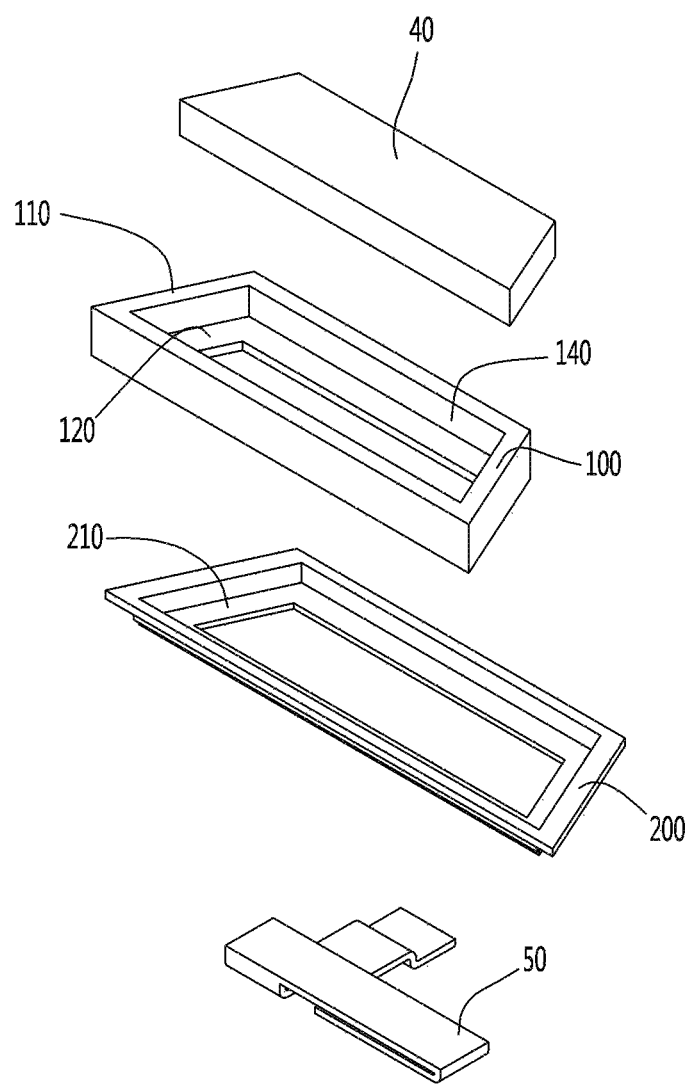
FIG. 2 is an exploded perspective view illustrating a home button and its peripheral structure in the mobile terminal according to the first embodiment of the present disclosure.
Figure 3:
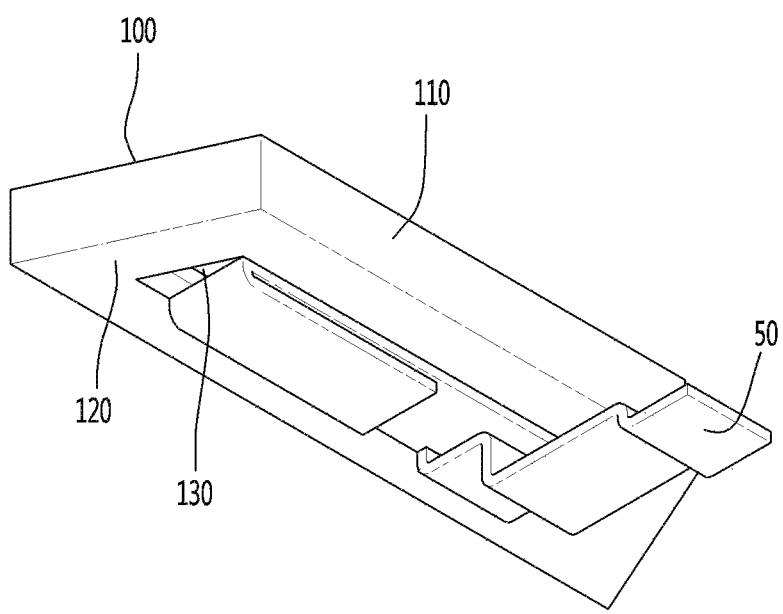
FIG. 3 is a perspective view, seen from below, illustrating an engagement structure between the home button and a flexible printed circuit board (FPCB) in the mobile terminal according to the first embodiment of the present disclosure.
Figure 4:
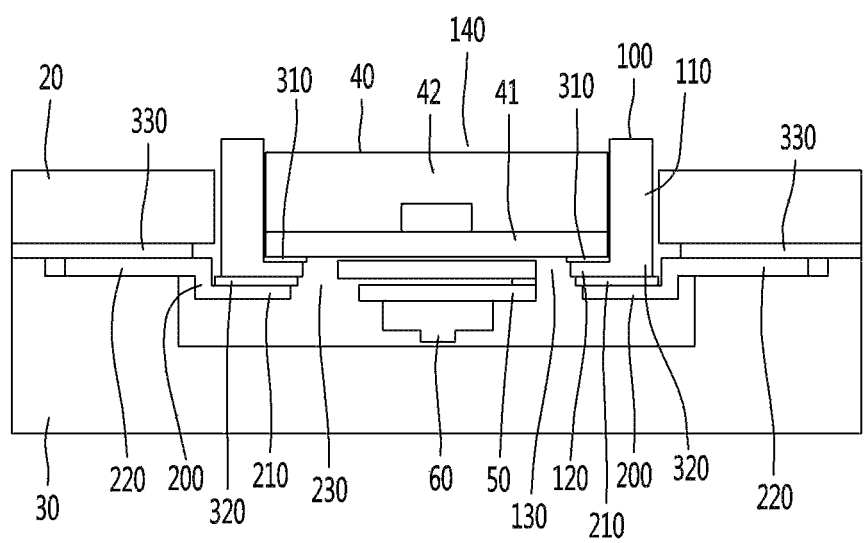
FIG. 4 is a sectional view illustrating the mobile terminal of FIG. 1, taken along line A-A.

FIG. 1 is a front view illustrating a mobile terminal according to a first embodiment of the present disclosure, FIG. 2 is an exploded perspective view illustrating a home button and its peripheral structure in the mobile terminal according to the first embodiment of the present disclosure, FIG. 3 is a perspective view, seen from below, illustrating an engagement structure between the home button and a flexible printed circuit board (FPCB) in the mobile terminal according to the first embodiment of the present disclosure, and FIG. 4 is a sectional view illustrating the mobile terminal of FIG. 1, taken along line A-A.

Referring to FIGS. 1 to 4, a mobile terminal 10 may include a frame 30, a window 20, a home button 100, a fingerprint recognition module 40, a sealing rubber 200, and adhesive members.

The frame 30 may form a body of the mobile terminal 10.

The window 20 may be disposed on the top surface of the frame 30. The window 20 may have a hole formed thereon, in which the home button 100 is arranged. The home button 100 may be positioned in the hole formed on the window 20.

The home button 100 and the fingerprint recognition module 40 may be exposed to the outside on the top surface of the mobile terminal 10. The home button 100 may protrude further outward than the window 20.

The fingerprint recognition module 40 may recognize a user's fingerprint. The fingerprint recognition module 40 may include a board portion 41 and a touch portion 42. When the user touches the touch portion 42 with his or her finger, the board portion 41 may transmit a sensed fingerprint as an electrical signal. The board portion 41 may be coupled to an FPCB 50 within the mobile terminal 10, and transmit the electrical signal of the sensed fingerprint to the FPCB 50.

The home button 100 may have an accommodation space 140 formed therein, in which the fingerprint recognition module 40 is accommodated. The fingerprint recognition module 40 may be accommodated in the accommodation space 140 formed in the home button 100. Once the fingerprint recognition module 40 is accommodated in the home button 100, the touch portion 42 of the fingerprint recognition module 40 may be exposed to the outside of the mobile terminal 10.

The home button 100 may include an outer body portion 110. The outer body portion 110 may form a periphery of the home button 100. Once the fingerprint recognition module 40 is accommodated in the home button 100, the outer body portion 110 may surround the touch portion 42 of the fingerprint recognition module 40. As the outer body portion 110 surrounds the touch portion 42 of the fingerprint recognition module 40, the outer body portion 110 may protect the touch portion 42 against ambient impacts.

A gap may be defined between the outer body portion 110 of the home button 100 and the window 20. Moisture may intrude into the gap between the outer body portion 110 and the window 20.

In addition, a gap may be generated between the outer body portion 110 of the home button 100 and the fingerprint recognition module 40. Moisture may intrude into the gap between the outer body portion 110 and the fingerprint recognition module 40.

Accordingly, there is a need for a structure capable of stably blocking the gap between the outer body portion 110 and the window 20 and the gap between the outer body portion 110 and the fingerprint recognition module 40, and preventing the intrusion of moisture into the gaps.

The home button 100 may include a spacer 120. The spacer 120 may be formed at the outer body portion 110 of the home button 100. The spacer 120 may act to space the sealing rubber 200 from the fingerprint recognition module 40. Or the spacer 120 may be disposed between the sealing rubber 200 and the fingerprint recognition module 40.

The spacer 120 may space the sealing rubber 200 from the fingerprint recognition module 40 by the thickness of the spacer 120. Or the spacer 120 may space the board portion 41 of the fingerprint recognition module 40 from a mounting portion 210 of the sealing rubber 200 by the thickness of the spacer 120.

The spacer 120 may be formed along a periphery of the outer body portion 110.

The spacer 120 may be formed along an inner periphery of the outer body portion 110.

The sealing rubber 200 may include a fixing portion 220 disposed between the frame 30 and the window 20, and the mounting portion 210 extending from the fixing portion 220, on which the home button 100 is mounted.

The mounting portion 210 may be formed along a periphery of the outer body portion 110.

The window 20 may include a hole formed thereon, in which the home button 100 is accommodated, and the fixing portion 220 may be formed around the hole of the window 20.

The sealing rubber 200 may be formed of an elastic material.

The mobile terminal 10 may include adhesive members for attaching the frame 30, the window 20, the home button 100, the fingerprint recognition module 40, and the sealing rubber 200 to each other, and preventing the intrusion of moisture.

The adhesive members may attach the components of the mobile terminal 10 to each other, and provide the waterproof function by preventing the intrusion of moisture between the components.

The adhesive members may be adhesive tapes.

Or, the adhesive members may be waterproof tapes.

The adhesive members may be classified as first to third adhesive members 310 to 330 according to their positions.

The first adhesive member 310 may be disposed between the fingerprint recognition module 40 and the spacer 120. Or, the first adhesive member 310 may be disposed between the board portion 41 of the fingerprint recognition module 40 and the spacer 120.

When the spacer 120 is formed along the periphery of the outer body portion 110, the first adhesive member 310 may be disposed between the spacer 120 and the fingerprint recognition module 40 along the periphery of the outer body portion 110.

The first adhesive member 310 may engage or attach the fingerprint recognition module 40 and the spacer 120 with or to each other. Or the first adhesive member 310 may engage or attach the board portion 41 of the fingerprint recognition module 40 and the spacer 120 with or to each other.

The first adhesive member 310 may prevent the intrusion of moisture into the gap between the outer body portion 110 of the home button 100 and the fingerprint recognition module 40.

The second adhesive member 320 may be disposed between the sealing rubber 200 and the spacer 120. Or the second adhesive member 320 may be disposed between the mounting portion 210 of the sealing rubber 200 and the spacer 120.

The second adhesive member 320 may engage or attach the sealing rubber 200 and the spacer 120 with or to each other. Or the second adhesive member 320 may engage or attach the mounting portion 210 of the sealing rubber 200 and the spacer 120 with or to each other.

When the spacer 120 is formed along the periphery of the outer body portion 110, the second adhesive member 320 may be disposed between the spacer 120 and the sealing rubber 200 along the periphery of the outer body portion 110.

The second adhesive member 320 may prevent the intrusion of moisture into the gap between the outer body portion 110 of the home button 100 and the window 20. The moisture may intrude in a path from below the home button 100 and a path between the fixing portion 220 of the sealing rubber 200 and the window 20. Among the water intrusion paths, the second adhesive member 320 may block the path from below the home button 100.

According to the conventional technology, the home button 100 is provided with a flange formed along an outer peripheral surface of the outer body portion 110. In contrast, according to the present disclosure, the home button 100 of the mobile terminal 10 may not be provided with a flange, and the home button 100, the fingerprint recognition module 40, and the sealing rubber 200 may be engaged with each other by means of the adhesive members disposed in the spacer 120.

The third adhesive member 330 may be disposed between the sealing rubber 200 and the window 20. Or the third adhesive member 330 may be disposed between the fixing portion 220 of the sealing rubber 200 and the window 20.

The third adhesive member 330 may engage or attach the sealing rubber 200 and the window 20 with or to each other. Or the third adhesive member 330 may engage or attach the fixing portion 220 of the sealing rubber 200 and the window 20 with or to each other.

The third adhesive member 330 may prevent the intrusion of moisture into the gap between the outer body portion 110 of the home button 100 and the window 20. Moisture may intrude in the path from below the home button 100 and the path between the fixing portion 220 of the sealing rubber 200 and the window 20. Among the water intrusion paths, the third adhesive member 330 may block a path between the outer body portion 110 of the home button 100 and the window 20.

The home button 100 may have a hole 130 formed thereon, through which the bottom surface of the board portion 41 of the fingerprint recognition module 40 is exposed. The sealing rubber 200 may have an opening 230 formed thereon, which faces the hole 130 of the home button 100. The opening 230 formed in the sealing rubber 200 may be larger than the hole 130 formed on the home button 100.

The spacer 20 may be the periphery of the hole 130 formed on the home button 100. The mounting portion 210 may be the periphery of the opening 230 of the sealing rubber 200.

The mobile terminal 10 may further include a dome switch 60 under the fingerprint recognition module 40. Or the mobile terminal 10 may further include the dome switch 60 under the board portion 41 of the fingerprint recognition module 40.

The bottom surface of the board portion 41 of the fingerprint recognition module 40 may be exposed through the hole 130 of the home button 100 and the opening 230 of the sealing rubber 200. The mobile terminal 10 may further include the FPCB 50 that connects the bottom surface of the board portion 41 to the dome switch 60.

The bottom surface of the board portion 41 of the fingerprint recognition module 40 may be connected to the FPCB 50 by surface mount technology (SMT).

A height from the dome switch 60 to the top surface of the fingerprint recognition module 40 may be reduced in view of the hole 130 of the home button 100 and the opening 230 of the sealing rubber 200. The height reduction may enable fabrication of the mobile terminal 10 with a small thickness.

According to the conventional technology, the entire bottom surface of the board portion of the fingerprint recognition module is surface-attached to the FPCB, and the flange of the home button is surface-attached to the FPCB. This is because the conventional mobile terminal is configured not to allow direct connection between the home button and the fingerprint recognition module.

However, the fingerprint recognition module 40 of the present disclosure is stably engaged with the home button 100 by means of the spacer 120 of the home button 100. Accordingly, bonding between the FPCB 50 and a part of the bottom surface of the board portion 41 of the fingerprint recognition module 40 leads to connection between the fingerprint recognition module 40 and the FPCB 50.

Further, according to the conventional technology, the FPCB, the home button, and the fingerprint recognition module are bonded by an anisotropic conductive film (ACF). However, the FPCB is required to have a thickness of about 0.34t for the ACF bonding. In view of the use of a thick FPCB for the ACF bonding, the conventional technology has limitations in its effectiveness in fabricating a slim mobile terminal.

On the other hand, the mobile terminal 10 of the present disclosure is advantageous in that the bottom surface of the board portion 40 of the fingerprint recognition module 40 can be connected to the FPCB 50 by SMT, thereby enabling fabrication of the mobile terminal 10 which is slim.

Figure 5:
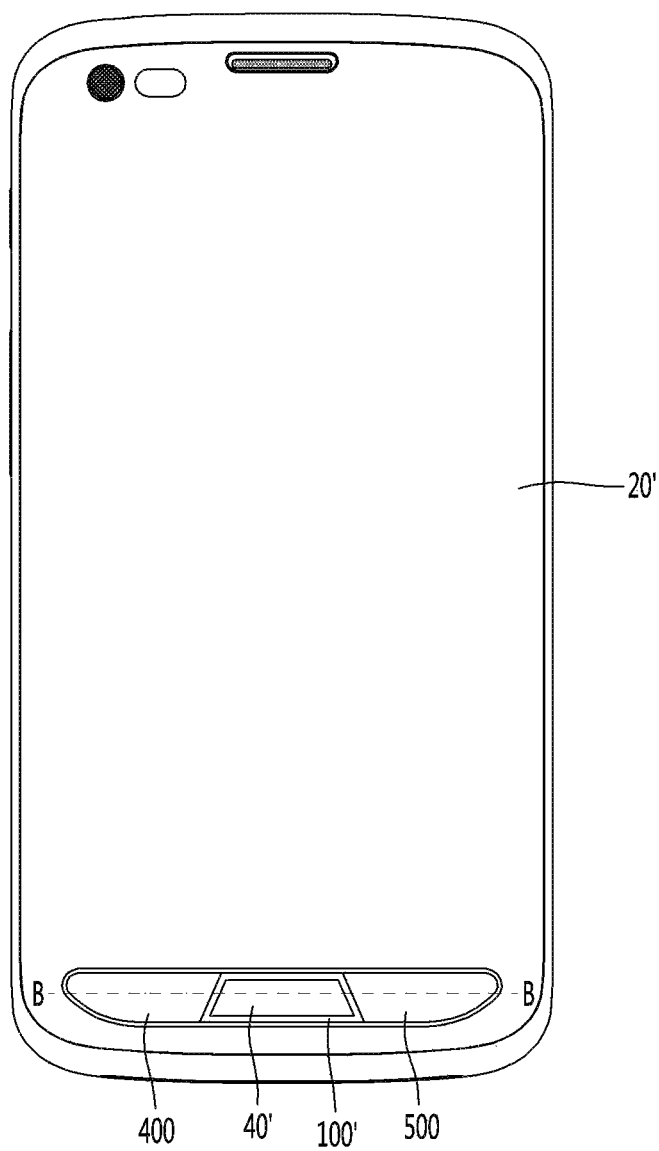
FIG. 5 is a front view illustrating a mobile terminal according to a second embodiment of the present disclosure.
Figure 6:
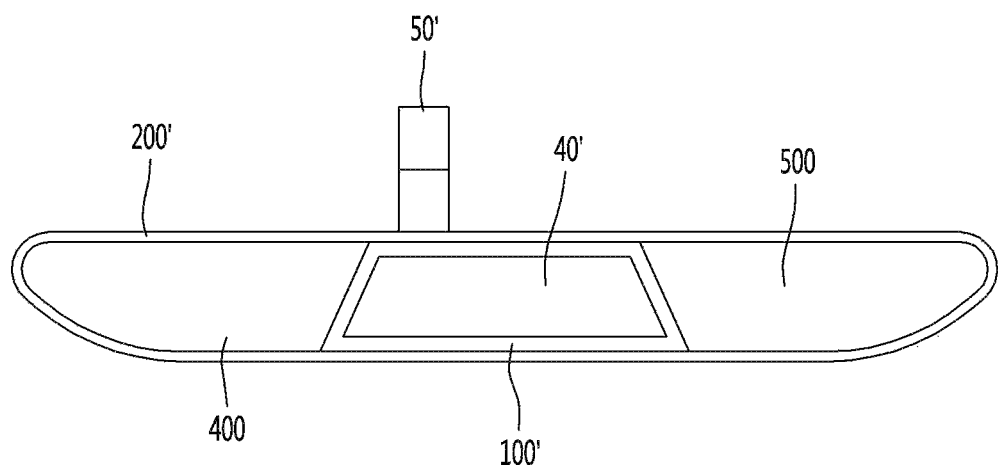
FIG. 6 is an enlarged view illustrating a home button and its peripheral structure in the mobile terminal according to the second embodiment of the present disclosure.
Figure 7:
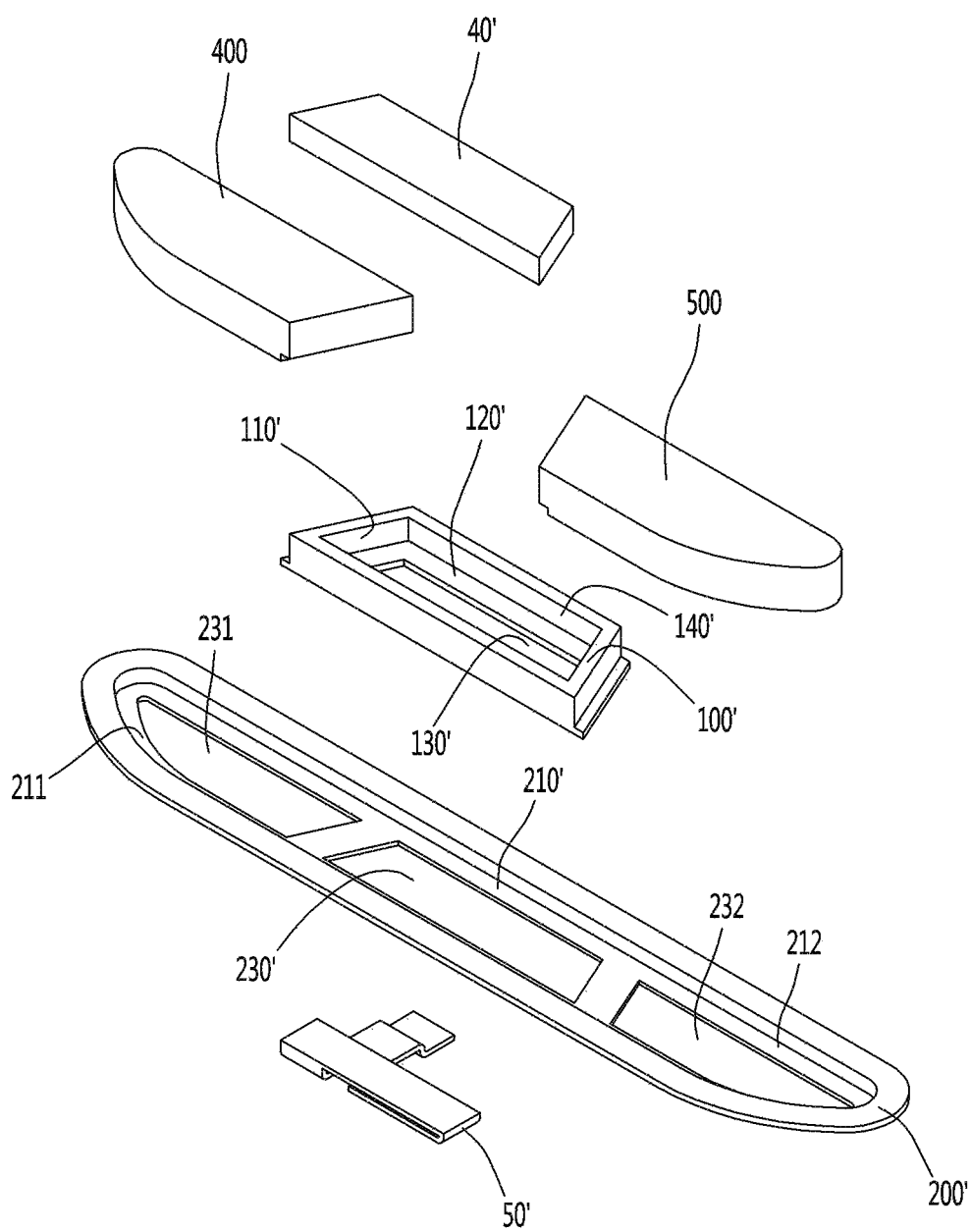
FIG. 7 is an exploded perspective view illustrating the home button and its peripheral structure in the mobile terminal according to the second embodiment of the present disclosure.
Figure 8:
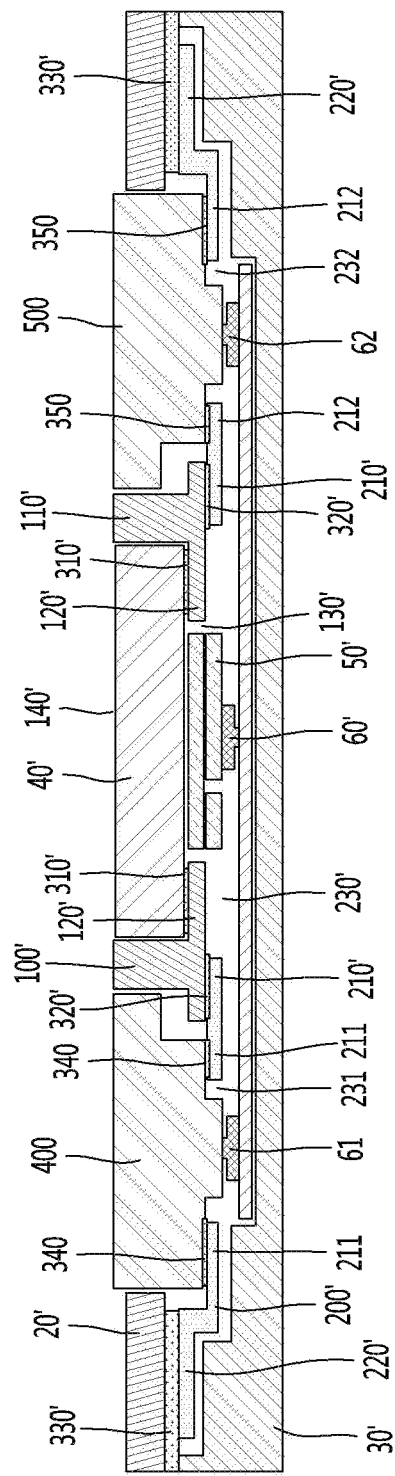
FIG. 8 is a sectional view illustrating the mobile terminal of FIG. 5, taken along line B-B.

FIG. 5 is a front view illustrating a mobile terminal according to a second embodiment of the present disclosure, FIG. 6 is an enlarged view illustrating a home button and its peripheral structure in the mobile terminal according to the second embodiment of the present disclosure. FIG. 7 is an exploded perspective view illustrating the home button and its peripheral structure in the mobile terminal according to the second embodiment of the present disclosure, and FIG. 8 is a sectional view illustrating the mobile terminal of FIG. 5, taken along line B-B.

The following description is given of a configuration and an operation different from the afore-described first embodiment, with the appreciation that a description of configuration identical or similar to the first embodiment is omitted in order to avoid redundancy.

A mobile terminal 10' may further include a second button 400 on one side of a home button 100'. A sealing rubber 200' may include a second mounting portion 211 which is formed between a fixing portion 220' and a mounting portion 210' and on which the second button 400 is mounted.

A window 20' may include holes in which the home button 100' and the second button 400 are disposed, and the fixing portion 220' may be formed around the holes of the window 20'.

The sealing rubber 200' may have a second opening 231 formed therein, through which the bottom of the second button 400 is exposed. The bottom of the second button 400, exposed through the second opening 231 may be connected to a second dome switch 61.

The mobile terminal 10' may further include a fourth adhesive member 340. The fourth adhesive member 340 may be disposed between the second mounting portion 211 and the second button 400.

When the second opening 231 is formed in the sealing rubber 200', the fourth adhesive member 340 may be disposed around the second opening 231, between the sealing rubber 200' and the second button 400.

The fourth adhesive member 340 may engage or attach the second mounting portion 211 and the second button 400 with or to each other.

A gap may be generated between an outer body portion 110' of the home button 100' and the second button 400. Moisture may intrude into the gap between the outer body portion 110' and the second button 400.

The fourth adhesive member 340 may prevent the intrusion of moisture into the gap between the second button 400 and the outer body portion 110' of the home button 100'.

A third adhesive member 330' may prevent the intrusion of moisture into the gap between the outer body portion 110' of the home button 100' and the window 20'. Further, the third adhesive member 330' may prevent the intrusion of moisture into the gap between the second button 400 and the window 20'.

The mobile terminal 10' may further include a third button 500 on the other side of the home button 100'. The sealing rubber 200' may include a third mounting portion 212 which is disposed between the fixing portion 220' and the mounting portion 210' and on which the third button 500 is mounted.

The window 20' may have holes formed thereon, in which the home button 100', the second button 400, and the third button 500 are accommodated, and the fixing portion 220' may be formed around the holes of the window 20'.

The sealing rubber 200' may have a third opening 232 formed thereon, through which the bottom of the third button 500 is exposed. The bottom of the third button 500, exposed through the third opening 232 may be connected to a third dome switch 62.

The mobile terminal 10' may further include a fifth adhesive member 350. The fifth adhesive member 350 may be disposed between the third mounting portion 212 and the third button 500.

When the third opening 232 is formed on the sealing rubber 200', the fifth adhesive member 350 may be disposed around the third opening 232, between the sealing rubber 200' and the third button 500.

The fifth adhesive member 350 may engage or attach the third mounting portion 212 and the third button 500 with or to each other.

A gap may be generated between the outer body portion 110' of the home button 100' and the third button 500. Moisture may intrude into the gap between the outer body portion 110' and the third button 500.

The fifth adhesive member 350 may prevent the intrusion of moisture into the gap between the third button 500 and the outer body portion 110' of the home button 100'.

The third adhesive member 330 may prevent the intrusion of moisture into the gap between the outer body portion 110' of the home button 100' and the window 20'. Further, the third adhesive member 330 may prevent the intrusion of moisture into the gap between the second button 400 and the window 20'. Further, the third adhesive member 330 may prevent the intrusion of moisture into the gap between the third button 500 and the window 20'.

Figure 9:
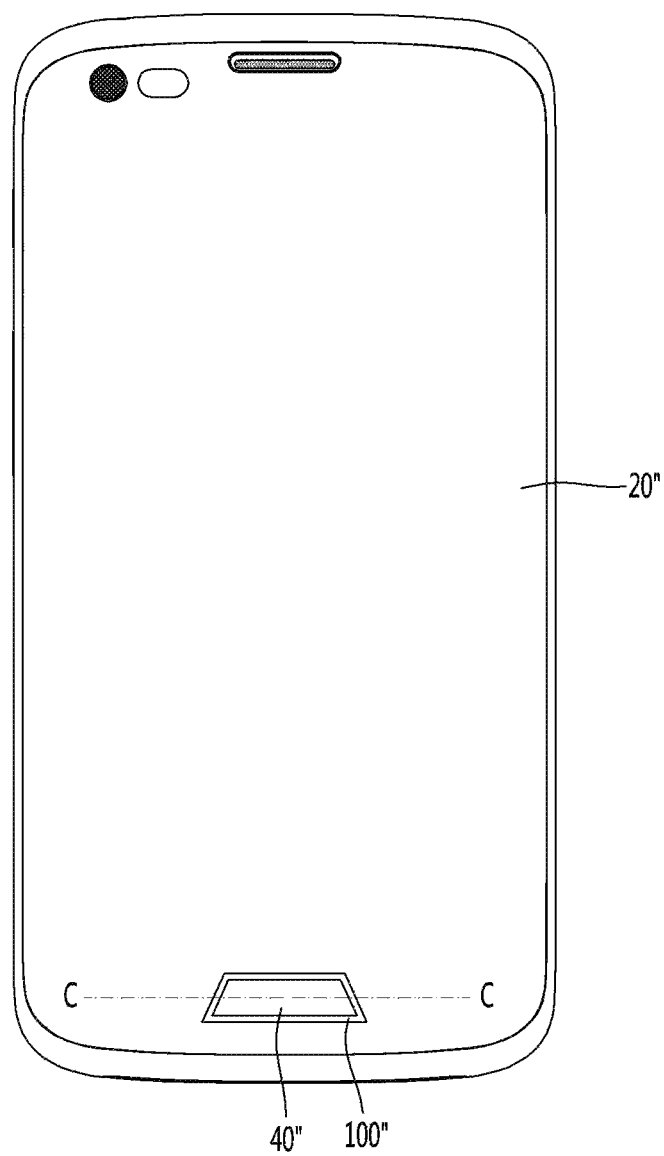
FIG. 9 is a front view illustrating a mobile terminal according to a third embodiment of the present disclosure.
Figure 10:
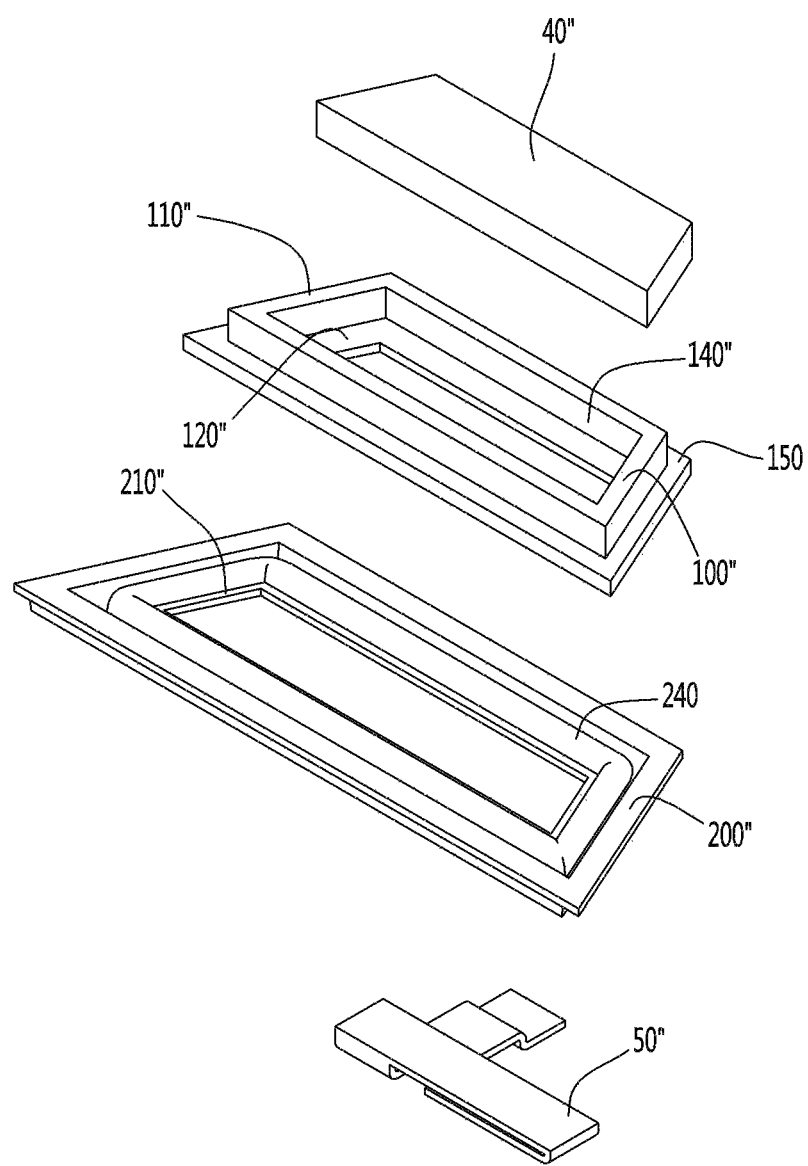
FIG. 10 is an exploded perspective view illustrating a home button and its peripheral structure in the mobile terminal according to the third embodiment of the present disclosure.
Figure 11:
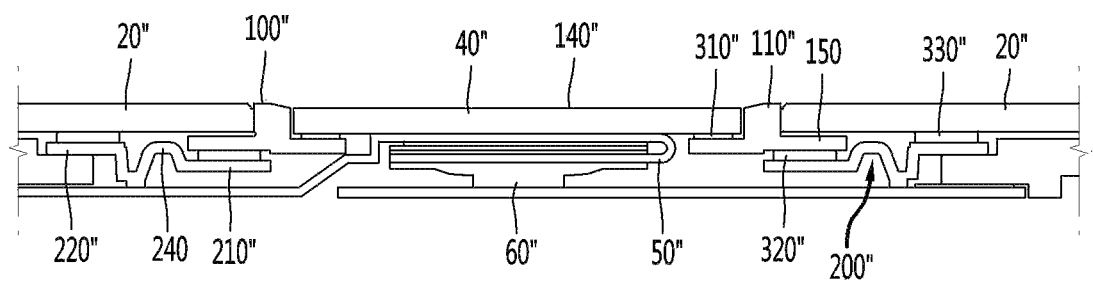
FIG. 11 is a sectional view illustrating the mobile terminal of FIG. 9, taken along line C-C.

FIG. 9 is a front view illustrating a mobile terminal according to a third embodiment of the present disclosure, FIG. 10 is an exploded perspective view illustrating a home button and its peripheral structure in the mobile terminal according to the third embodiment of the present disclosure, and FIG. 11 is a sectional view illustrating the mobile terminal of FIG. 9, taken along line C-C.

The following description is given of a configuration and an operation different from the afore-described first embodiment, with the appreciation that a description of a configuration identical or similar to the first embodiment is omitted in order to avoid redundancy.

A home button 10" may further include a flange 150 formed along a periphery of an outer body portion 110".

A sealing rubber 200" may further include an elastic deformation portion 240" that connects a mounting portion 210" to a fixing portion 220".

A second adhesive member 320" may be disposed between the mounting portion 210" of the sealing rubber 200" and the flange 150 of the home button 10".

The second adhesive member 320" may engage or attach the flange 150 and the sealing rubber 200" with or to each other. Or, the second adhesive member 320" may engage or attach the flange 150 and the mounting portion 210" of the sealing rubber 200" with or to each other.

When the flange 150 is formed along the periphery of the outer body portion 110", the second adhesive member 320" may be disposed along the periphery of the outer body portion 110", between the flange 150 and the sealing rubber 200".

The second adhesive member 320" may prevent the intrusion of moisture into the gap between the outer body portion 110" and a window 20".

A third adhesive member 330" may be disposed between the fixing portion 220" of the sealing rubber 200" and the window 20".

The third adhesive member 330" may engage or attach the window 20" and the sealing rubber 200" with or to each other. Or the third adhesive member 330" may engage or attach the window 20" and the fixing portion 220" of the sealing rubber 200" with or to each other.

The third adhesive member 330" may prevent the intrusion of moisture into the gap between the outer body portion 110" of the home button 10" and the window 20".

When the home button 10" is stroked or moves down, the elastic deformation portion 240" may be deformed. The deformed elastic deformation portion 240" may have restoring force.

As such, when the user strokes the home button 10" or moves down the home button 10", the home button 10" may receive restoring force from the elastic deformation portion 240" of the sealing rubber 200". The restoring force from the elastic deformation portion 240" may be directed to the original position of the home button 10". Having received the restoring force, the home button 10" may stably return to its original position.

If the sealing rubber 200" is provided with the elastic deformation portion 240", the home button 10" may receive more stable restoring force than when only a dome switch 60" is provided.

Figure 12A:
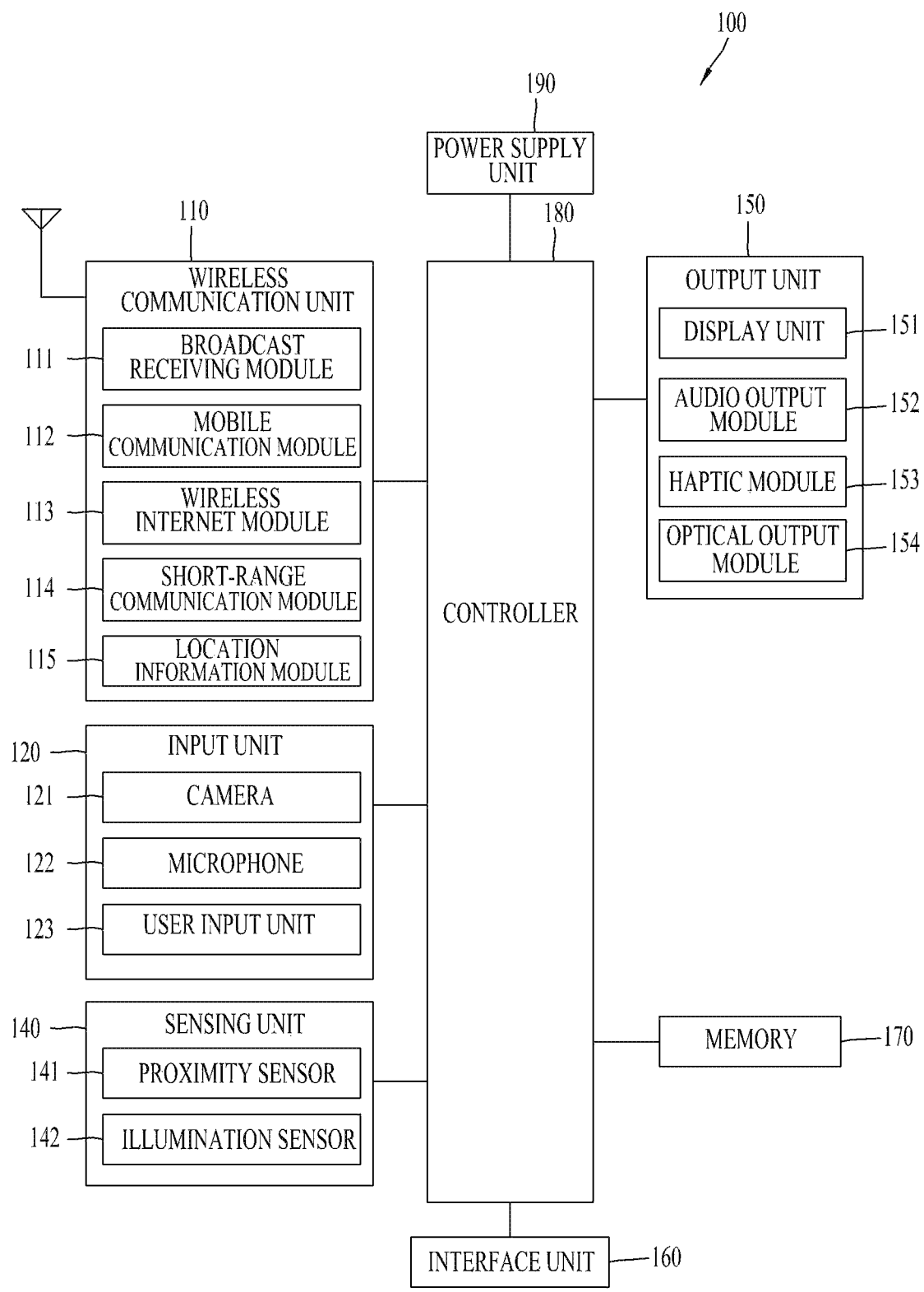
FIG. 12a is a block diagram referred to for describing a mobile terminal related to the present disclosure.
Figure 12B:
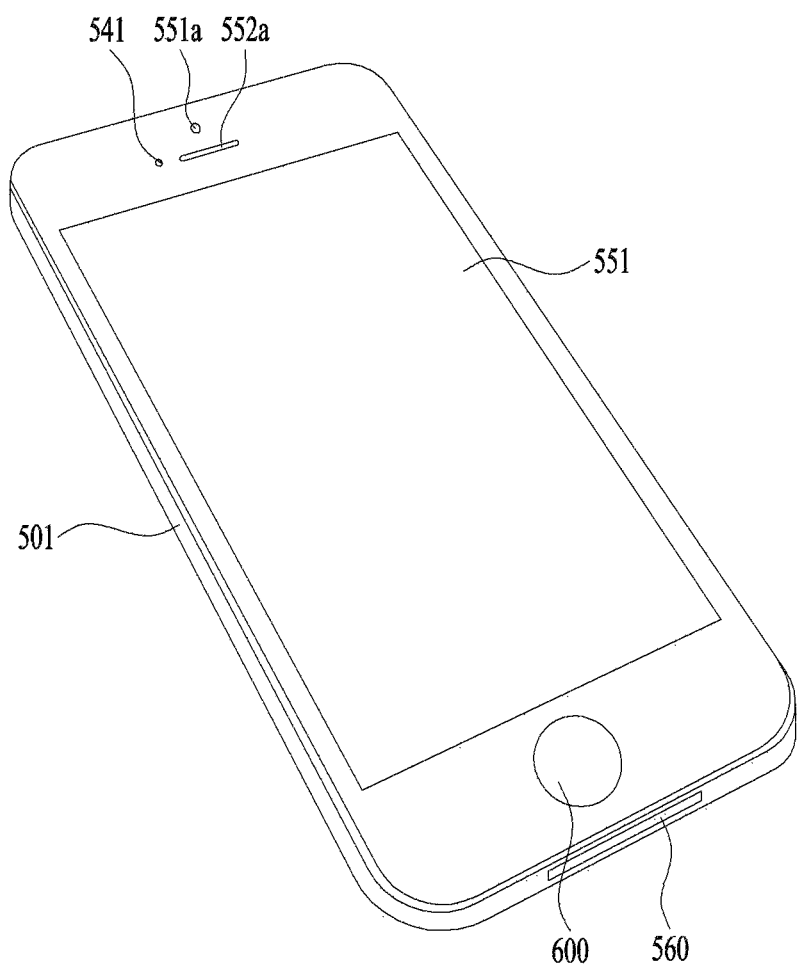
FIGS. 12b and 12c are conceptual views illustrating an example of the mobile terminal related to the present disclosure, seen from different directions.
Figure 12:
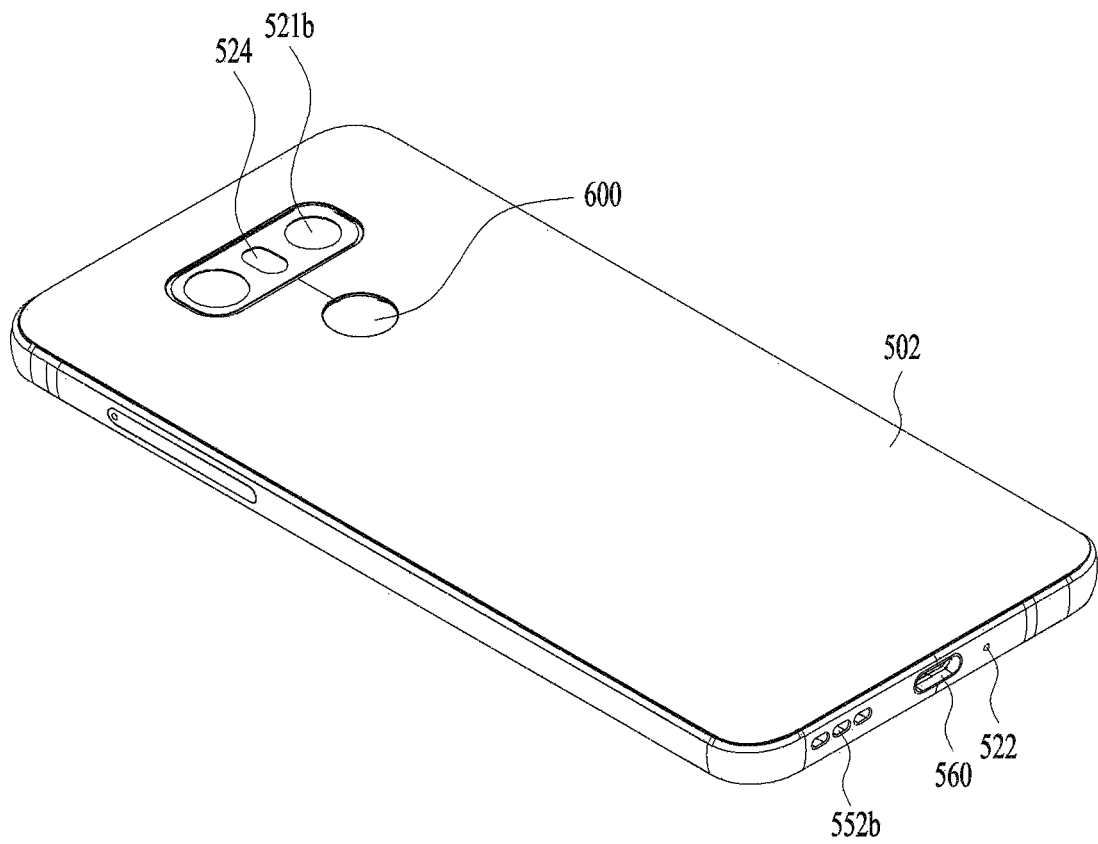

Reference is now made to FIGS. 12A-12C, where FIG. 12A is a block diagram of a mobile terminal in accordance with the present disclosure, and FIGS. 12B and 12C are conceptual views of one example of the mobile terminal, viewed from different directions.

The mobile terminal 500 is shown having components such as a wireless communication unit 510, an input unit 520, a sensing unit 540, an output unit 550, an interface unit 560, a memory 570, a controller 580, and a power supply unit 590. It is understood that implementing all of the illustrated components in The FIG. 12A is not a requirement, and that greater or fewer components may alternatively be implemented.

More specifically, the wireless communication unit 510 typically includes one or more modules which permit communications such as wireless communications between the mobile terminal 500 and a wireless communication system, communications between the mobile terminal 500 and another mobile terminal, communications between the mobile terminal 500 and an external server. Further, the wireless communication unit 510 typically includes one or more modules which connect the mobile terminal 500 to one or more networks.

To facilitate such communications, the wireless communication unit 510 includes one or more of a broadcast receiving module 511, a mobile communication module 512, a wireless Internet module 513, a short-range communication module 514, and a location information module 515.

The input unit 520 includes a camera 521 for obtaining images or video, a microphone 522, which is one type of audio input device for inputting an audio signal, and a user input unit 523 (for example, a touch key, a push key, a mechanical key, a soft key, and the like) for allowing a user to input information. Data (for example, audio, video, image, and the like) is obtained by the input unit 520 and may be analyzed and processed by controller 580 according to device parameters, user commands, and combinations thereof.

The sensing unit 540 is typically implemented using one or more sensors configured to sense internal information of the mobile terminal, the surrounding environment of the mobile terminal, user information, and the like. For example, the sensing unit 540 may alternatively or additionally include other types of sensors or devices, such as a proximity sensor 541 and an illumination sensor 542, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 521), a microphone 522, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 500 may be configured to utilize information obtained from sensing unit 540, and in particular, information obtained from one or more sensors of the sensing unit 540, and combinations thereof.

The output unit 550 is typically configured to output various types of information, such as audio, video, tactile output, and the like. The output unit 550 is shown having a display unit 551, an audio output module 552, a haptic module 553, and an optical output module 554. The display unit 551 may have an inter-layered structure or an integrated structure with a touch sensor in order to facilitate a touch screen. The touch screen may provide an output interface between the mobile terminal 500 and a user, as well as function as the user input unit 523 which provides an input interface between the mobile terminal 500 and the user.

The interface unit 560 serves as an interface with various types of external devices that can be coupled to the mobile terminal 500. The interface unit 560, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 500 may perform assorted control functions associated with a connected external device, in response to the external device being connected to the interface unit 560.

The memory 570 is typically implemented to store data to support various functions or features of the mobile terminal 500. For instance, the memory 570 may be configured to store application programs executed in the mobile terminal 500, data or instructions for operations of the mobile terminal 500, and the like. Some of these application programs may be downloaded from an external server via wireless communication. Other application programs may be installed within the mobile terminal 500 at time of manufacturing or shipping, which is typically the case for basic functions of the mobile terminal 500 (for example, receiving a call, placing a call, receiving a message, sending a message, and the like). It is common for application programs to be stored in the memory 570, installed in the mobile terminal 500, and executed by the controller 580 to perform an operation (or function) for the mobile terminal 500.

The controller 580 typically functions to control overall operation of the mobile terminal 500, in addition to the operations associated with the application programs. The controller 580 may provide or process information or functions appropriate for a user by processing signals, data, information and the like, which are input or output, or activating application programs stored in the memory 570.

To drive the application programs stored in the memory 570, the controller 580 may be implemented to control a predetermined number of the components mentioned above in reference with FIG. 12A. Moreover, the controller 580 may be implemented to combinedly operate two or more of the components provided in the mobile terminal 500 to drive the application programs.

The power supply unit 590 can be configured to receive external power or provide internal power in order to supply appropriate power required for operating elements and components included in the mobile terminal 500. The power supply unit 590 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 570.

Hereinafter, referring to FIG. 12A, the components mentioned above will be described in detail before describing the various embodiments which are realized by the mobile terminal 500 in accordance with the present disclosure.

Regarding the wireless communication unit 510, the broadcast receiving module 511 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 511 may be utilized to facilitate simultaneously receiving of two or more broadcast channels, or to support switching among broadcast channels.

The mobile communication module 512 can transmit and/or receive wireless signals to and from one or more network entities. Typical examples of a network entity include a base station, an external mobile terminal, a server, and the like. Such network entities form portion of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 512 include audio call signals, video (telephony) call signals, or various formats of data to support communication of text and multimedia messages.

The wireless Internet module 513 is configured to facilitate wireless Internet access. This module may be internally or externally coupled to the mobile terminal 500. The wireless Internet module 513 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 513 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as portion of a mobile communication network, the wireless Internet module 513 performs such wireless Internet access. As such, the Internet module 513 may cooperate with, or function as, the mobile communication module 512.

The short-range communication module 514 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 514 in general supports wireless communications between the mobile terminal 500 and a wireless communication system, communications between the mobile terminal 500 and another mobile terminal 500, or communications between the mobile terminal and a network where another mobile terminal 500 (or an external server) is located, via wireless area networks. One example of the wireless area networks is a wireless personal area networks.

In some embodiments, another mobile terminal (which may be configured similarly to mobile terminal 500) may be a wearable device, for example, a smart watch, a smart glass or a head mounted display (HMD), which is able to exchange data with the mobile terminal 500 (or otherwise cooperate with the mobile terminal 500). The short-range communication module 514 may sense or recognize the wearable device, and permit communication between the wearable device and the mobile terminal 500. In addition, when the sensed wearable device is a device which is authenticated to communicate with the mobile terminal 500, the controller 580, for example, may cause transmission of data processed in the mobile terminal 500 to the wearable device via the short-range communication module 514. Hence, a user of the wearable device may use the data processed in the mobile terminal 500 on the wearable device. For example, when a call is received in the mobile terminal 500, the user may answer the call using the wearable device. Also, when a message is received in the mobile terminal 500, the user can check the received message using the wearable device.

The location information module 515 is generally configured to detect, calculate, derive or otherwise identify a position of the mobile terminal. As an example, the location information module 515 includes a Global Position System (GPS) module, a Wi-Fi module, or both. If desired, the location information module 515 may alternatively or additionally function with any of the other modules of the wireless communication unit 510 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 520 may be configured to permit various types of input to the mobile terminal 520. Examples of such input include audio, image, video, data, and user input. Image and video input is often obtained using one or more cameras 521. Such cameras 521 may process image frames of still pictures or video obtained by image sensors in a video or image capture mode. The processed image frames can be displayed on the display unit 551 or stored in memory 570. In some cases, the cameras 521 may be arranged in a matrix configuration to permit a plurality of images having various angles or focal points to be input to the mobile terminal 500. As another example, the cameras 521 may be located in a stereoscopic arrangement to acquire left and right images for implementing a stereoscopic image.

The microphone 522 is generally implemented to permit audio input to the mobile terminal 500. The audio input can be processed in various manners according to a function being executed in the mobile terminal 500. If desired, the microphone 522 may include assorted noise removing algorithms to remove unwanted noise generated in the course of receiving the external audio.

The user input unit 523 is a component that permits input by a user. Such user input may enable the controller 580 to control operation of the mobile terminal 500. The user input unit 523 may include one or more of a mechanical input element (for example, a key, a button located on a front and/or rear surface or a side surface of the mobile terminal 500, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 540 is generally configured to sense one or more of internal information of the mobile terminal, surrounding environment information of the mobile terminal, user information, or the like. The controller 580 generally cooperates with the sensing unit 540 to control operation of the mobile terminal 500 or execute data processing, a function or an operation associated with an application program installed in the mobile terminal based on the sensing provided by the sensing unit 540. The sensing unit 540 may be implemented using any of a variety of sensors, some of which will now be described in more detail.

The proximity sensor 541 may include a sensor to sense presence or absence of an object approaching a surface, or an object located near a surface, by using an electromagnetic field, infrared rays, or the like without a mechanical contact. The proximity sensor 541 may be arranged at an inner region of the mobile terminal covered by the touch screen, or near the touch screen.

The proximity sensor 541, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 541 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 541 may sense proximity touch, and proximity touch patterns (for example, distance, direction, speed, time, position, moving status, and the like).

In general, controller 580 processes data corresponding to proximity touches and proximity touch patterns sensed by the proximity sensor 541, and cause output of visual information on the touch screen. In addition, the controller 580 can control the mobile terminal 500 to execute different operations or process different data according to whether a touch with respect to a point on the touch screen is either a proximity touch or a contact touch.

A touch sensor can sense a touch applied to the touch screen, such as display unit 551, using any of a variety of touch methods. Examples of such touch methods include a resistive type, a capacitive type, an infrared type, and a magnetic field type, among others.

As one example, the touch sensor may be configured to convert changes of pressure applied to a specific portion of the display unit 551, or convert capacitance occurring at a specific portion of the display unit 551, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 580. Accordingly, the controller 580 may sense which region of the display unit 551 has been touched. Here, the touch controller may be a component separate from the controller 580, the controller 580, and combinations thereof.

In some embodiments, the controller 580 may execute the same or different controls according to a type of touch object that touches the touch screen or a touch key provided in addition to the touch screen. Whether to execute the same or different control according to the object which provides a touch input may be decided based on a current operating state of the mobile terminal 500 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 580, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 521 typically includes at least one a camera sensor (CCD, CMOS etc.), a photo sensor (or image sensors), and a laser sensor.

Implementing the camera 521 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 551 is generally configured to output information processed in the mobile terminal 500. For example, the display unit 551 may display execution screen information of an application program executing at the mobile terminal 500 or user interface (UI) and graphic user interface (GUI) information in response to the execution screen information.

In some embodiments, the display unit 551 may be implemented as a stereoscopic display unit for displaying stereoscopic images.

A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 552 is generally configured to output audio data. Such audio data may be obtained from any of a number of different sources, such that the audio data may be received from the wireless communication unit 510 or may have been stored in the memory 570. The audio data may be output during modes such as a signal reception mode, a call mode, a record mode, a voice recognition mode, a broadcast reception mode, and the like. The audio output module 552 can provide audible output related to a particular function (e.g., a call signal reception sound, a message reception sound, etc.) performed by the mobile terminal 500.

The audio output module 552 may also be implemented as a receiver, a speaker, a buzzer, or the like.

A haptic module 553 can be configured to generate various tactile effects that a user feels, perceive, or otherwise experience. A typical example of a tactile effect generated by the haptic module 553 is vibration. The strength, pattern and the like of the vibration generated by the haptic module 553 can be controlled by user selection or setting by the controller. For example, the haptic module 553 may output different vibrations in a combining manner or a sequential manner.

Besides vibration, the haptic module 553 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 553 can also be implemented to allow the user to feel a tactile effect through a muscle sensation such as the user's fingers or arm, as well as transferring the tactile effect through direct contact. Two or more haptic modules 553 may be provided according to the particular configuration of the mobile terminal 500.

An optical output module 554 can output a signal for indicating an event generation using light of a light source. Examples of events generated in the mobile terminal 500 may include message reception, call signal reception, a missed call, an alarm, a schedule notice, an email reception, information reception through an application, and the like.

A signal output by the optical output module 554 may be implemented in such a manner that the mobile terminal emits monochromatic light or light with a plurality of colors. The signal output may be terminated as the mobile terminal senses that a user has checked the generated event, for example.

The interface unit 560 serves as an interface for external devices to be connected with the mobile terminal 500. For example, the interface unit 560 can receive data transmitted from an external device, receive power to transfer to elements and components within the mobile terminal 500, or transmit internal data of the mobile terminal 500 to such external device. The interface unit 560 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 500 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 500 via the interface unit 560.

When the mobile terminal 500 is connected with an external cradle, the interface unit 560 can serve as a passage to allow power from the cradle to be supplied to the mobile terminal 500 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 570 can store programs to support operations of the controller 580 and store input/output data (for example, phonebook, messages, still images, videos, etc.). The memory 570 may store data related to various patterns of vibrations and audio which are output in response to touch inputs on the touch screen.

The memory 570 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 500 may also be operated in relation to a network storage device that performs the storage function of the memory 570 over a network, such as the Internet.

The controller 580 may typically control the general operations of the mobile terminal 500. For example, the controller 580 may set or release a lock state for restricting a user from inputting a control command with respect to applications when a status of the mobile terminal meets a preset condition.

The controller 580 can also perform the controlling and processing associated with voice calls, data communications, video calls, and the like, or perform pattern recognition processing to recognize a handwriting input or a picture drawing input performed on the touch screen as characters or images, respectively. In addition, the controller 580 can control one or a combination of those components in order to implement various exemplary embodiments disclosed herein.

The power supply unit 590 may be provided with the power supplied by an external power source and the power supplied therein under the control of the controller 580 so as to supply the needed power to each of the components. The power supply unit 590 may include a battery. The battery may be a built-in type which is rechargeable and detachably loaded in the terminal to be charged.

The power supply unit 590 may include a connection port. The connection port may be configured as one example of the interface unit 560 to which an external charger for supplying power to recharge the battery is electrically connected.

As another example, the power supply unit 590 may be configured to recharge the battery in a wireless manner without use of the connection port. In this example, the power supply unit 590 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Referring now to FIGS. 12B and 12C, the mobile terminal 500 is described with reference to a bar-type terminal body. However, the mobile terminal 500 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

Here, the terminal body may be understood to refer to the concept of this bore a mobile terminal (100) to at least one of the aggregate.

The mobile terminal 500 will generally include a case (for example, frame, housing, cover, and the like) forming the appearance of the terminal. In this embodiment, the case is formed using a front case 501 and a rear case 502. Various electronic components are incorporated into a space formed between the front case 501 and the rear case 502. At least one middle case may be additionally positioned between the front case 501 and the rear case 502.

The display unit 551 is shown located on the front side of the terminal body to output information. As illustrated, a window 551a of the display unit 551 may be mounted to the front case 501 to form the front surface of the terminal body together with the front case 501.

In some embodiments, electronic components may also be mounted to the rear case 502. Examples of such electronic components include a detachable battery 591, an identification module, a memory card, and the like. Rear cover 503 is shown covering the electronic components, and this cover may be detachably coupled to the rear case 502. Therefore, when the rear cover 503 is detached from the rear case 502, the electronic components mounted to the rear case 502 are externally exposed.

As illustrated, when the rear cover 503 is coupled to the rear case 502, a side surface of the rear case 502 is partially exposed. In some cases, upon the coupling, the rear case 502 may also be completely shielded by the rear cover 503. In some embodiments, the rear cover 503 may include an opening for externally exposing a camera 521b or an audio output module 552b.

The cases 501, 502, 503 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 500 may be configured such that one case forms the inner space. In this example, a mobile terminal 500 having a uni-body is formed in such a manner that synthetic resin or metal extends from a side surface to a rear surface.

If desired, the mobile terminal 500 may include a waterproofing unit (not shown) for preventing intrusion of water into the terminal body. For example, the waterproofing unit may include a waterproofing member which is located between the window 551a and the front case 501, between the front case 501 and the rear case 502, or between the rear case 502 and the rear cover 503, to hermetically seal an inner space when those cases are coupled.

The mobile terminal 500 may include the display unit 551, the audio output module, the proximity sensor 541, the illuminance sensor 542, the optical output module 554, the camera 521, the user input unit 523, the microphone 522 and the interface unit 560

It will be described for the mobile terminal as shown in FIGS. 12B and 12C. The display unit 551, the first audio output module 552a, the proximity sensor 541, an illumination sensor 542, the optical output module 554, the first camera 521a and the first manipulation unit 523a are arranged in front surface of the terminal body, the second manipulation unit 523b, the microphone 522 and interface unit 560 are arranged in side surface of the terminal body, and the second audio output modules 552b and the second camera 521b are arranged in rear surface of the terminal body.

It is to be understood that alternative arrangements are possible and within the teachings of the instant disclosure. Some components may be omitted or rearranged. For example, the first manipulation unit 523a may be located on another surface of the terminal body, and the second audio output module 552b may be located on the side surface of the terminal body.

The display unit 551 is generally configured to output information processed in the mobile terminal 500. For example, the display unit 551 may display execution screen information of an application program executing at the mobile terminal 500 or user interface (UI) and graphic user interface (GUI) information in response to the execution screen information.

The display unit 551 outputs information processed in the mobile terminal 500. The display unit 551 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 551 may be implemented using two display devices, which can implement the same or different display technology. For instance, a plurality of the display units 551 may be arranged on one side, either spaced apart from each other, or these devices may be integrated, or these devices may be arranged on different surfaces.

The display unit 551 may also include a touch sensor which senses a touch input received at the display unit. When a touch is input to the display unit 551, the touch sensor may be configured to sense this touch and the controller 580, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 551a and a display on a rear surface of the window 551a, or a metal wire which is patterned directly on the rear surface of the window 551a. Alternatively, the touch sensor may be integrally formed with the display. For example, the touch sensor may be disposed on a substrate of the display or within the display.

The display unit 551 may also form a touch screen together with the touch sensor. Here, the touch screen may serve as the user input unit 523 (see FIG. 5A). Therefore, the touch screen may replace at least some of the functions of the first manipulation unit 523a.

The first audio output module 552a may be implemented in the form of a speaker to output voice audio, alarm sounds, multimedia audio reproduction, and the like.

The window 551a of the display unit 551 will typically include an aperture to permit audio generated by the first audio output module 552a to pass. One alternative is to allow audio to be released along an assembly gap between the structural bodies (for example, a gap between the window 551a and the front case 501). In this case, a hole independently formed to output audio sounds may not be seen or is otherwise hidden in terms of appearance, thereby further simplifying the appearance and manufacturing of the mobile terminal 500.

The optical output module 554 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 554 to stop the light output.

The first camera 521a can process image frames such as still or moving images obtained by the image sensor in a capture mode or a video call mode. The processed image frames can then be displayed on the display unit 551 or stored in the memory 570.

The first and second manipulation units 523a and 523b are examples of the user input unit 523, which may be manipulated by a user to provide input to the mobile terminal 500. The first and second manipulation units 523a and 523b may also be commonly referred to as a manipulating portion, and may employ any tactile method that allows the user to perform manipulation such as touch, push, scroll, or the like. The first and second manipulation units 523a and 523b may also employ any non-tactile method that allows the user to perform manipulation such as proximity touch, hovering, or the like.

FIG. 12B illustrates the first manipulation unit 523a as a touch key, but possible alternatives include a mechanical key, a push key, a touch key, and combinations thereof.

Input received at the first and second manipulation units 523a and 523b may be used in various ways. For example, the first manipulation unit 523a may be used by the user to provide an input to a menu, home key, cancel, search, or the like, and the second manipulation unit 523b may be used by the user to provide an input to control a volume level being output from the first or second audio output modules 552a or 552b, to switch to a touch recognition mode of the display unit 551, or the like.

As another example of the user input unit 523, a rear input unit (not shown) may be located on the rear surface of the terminal body. The rear input unit can be manipulated by a user to provide input to the mobile terminal 500. The input may be used in a variety of different ways. For example, the rear input unit may be used by the user to provide an input for power on/off, start, end, scroll, control volume level being output from the first or second audio output modules 552a or 552b, switch to a touch recognition mode of the display unit 551, and the like. The rear input unit may be configured to permit touch input, a push input, or combinations thereof.

The rear input unit may be located to overlap the display unit 551 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 523a in the rear input unit. As such, in situations where the first manipulation unit 523a is omitted from the front side, the display unit 551 can have a larger screen.

As a further alternative, the mobile terminal 500 may include a finger scan sensor which scans a user's fingerprint. The controller 580 can then use fingerprint information sensed by the finger scan sensor as portion of an authentication procedure. The finger scan sensor may also be installed in the display unit 551 or implemented in the user input unit 523.

The microphone 522 is shown located at an end of the mobile terminal 500, but other locations are possible. If desired, multiple microphones may be implemented, with such an arrangement permitting the receiving of stereo sounds.

The interface unit 560 may serve as a path allowing the mobile terminal 500 to interface with external devices. For example, the interface unit 560 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 500. The interface unit 560 may be implemented in the form of a socket for accommodating an external card, such as Subscriber Identification Module (SIM), User Identity Module (UIM), or a memory card for information storage.

The second camera 521*b* is shown located at the rear side of the terminal body and includes an image capturing direction that is substantially opposite to the image capturing direction of the first camera unit 521*a*. If desired, second camera 521*a* may alternatively be located at other locations, or made to be moveable, in order to have a different image capturing direction from that which is shown.

The second camera 521*b* can include a plurality of lenses arranged along at least one line. The plurality of lenses may also be arranged in a matrix configuration. The cameras may be referred to as an "array camera." When the second camera 521*b* is implemented as an array camera, images may be captured in various manners using the plurality of lenses and images with better qualities.

A flash 524 is shown located adjacent to the second camera 521*b*. When an image of a subject is captured with the camera 521*b*, the flash 524 may illuminate the subject.

The second audio output module 552*b* can be located on the terminal body. The second audio output module 552*b* may implement stereophonic sound functions in conjunction with the first audio output module 552*a*, and may be also used for implementing a speaker phone mode for call communication.

At least one antenna for wireless communication may be located on the terminal body. The antenna may be installed in the terminal body or formed by the case. For example, an antenna which configures a portion of the broadcast receiving module 511 (see FIG. 12A), may be retractable into the terminal body. Alternatively, an antenna may be formed using a film attached to an inner surface of the rear cover 503, or a case that includes a conductive material.

A power supply unit 590 for supplying power to the mobile terminal 500 may include a battery 591, which is mounted in the terminal body or detachably coupled to an outside of the terminal body.

The battery 591 may receive power via a power source cable connected to the interface unit 560. Also, the battery 591 can be recharged in a wireless manner using a wireless charger. Wireless charging may be implemented by magnetic induction or electromagnetic resonance.

The rear cover 503 is shown coupled to the rear case 502 for shielding the battery 591, to prevent separation of the battery 591, and to protect the battery 591 from an external impact or from foreign material. When the battery 591 is detachable from the terminal body, the rear case 503 may be detachably coupled to the rear case 502.

An accessory for protecting an appearance or assisting or extending the functions of the mobile terminal 500 can also be provided on the mobile terminal 500. As one example of an accessory, a cover or pouch for covering or accommodating at least one surface of the mobile terminal 500 may be provided. The cover or pouch may cooperate with the display unit 551 to extend the function of the mobile terminal 500. Another example of the accessory is a touch pen for assisting or extending a touch input to a touch screen.

Figure 13:
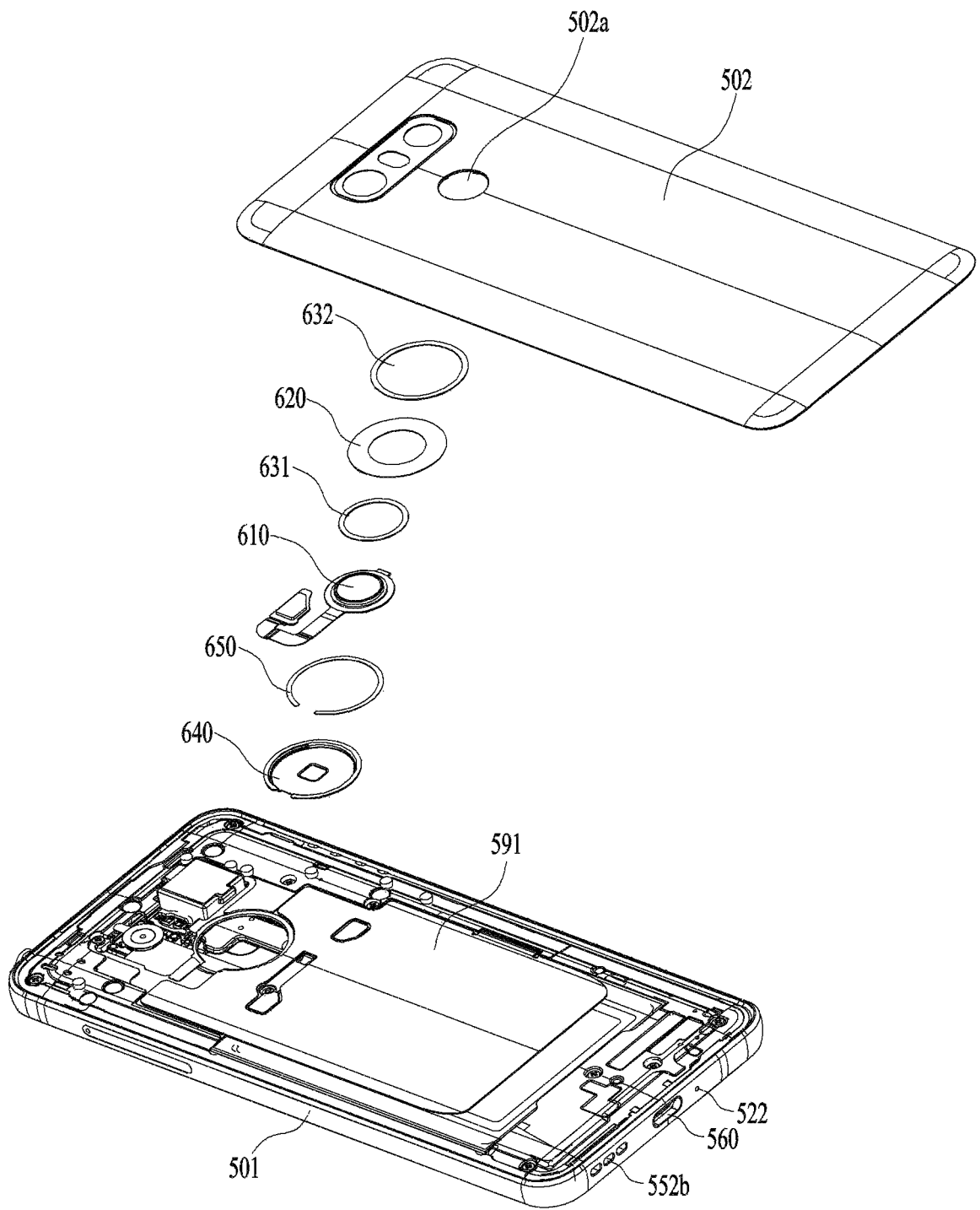
FIG. 13 is an exploded perspective view of the mobile terminal related to the present disclosure.

FIG. 13 is an exploded perspective view illustrating the mobile terminal 500 related to the present disclosure. A button 600 which, as a user input unit 123, generates a signal when it is pressed physically may be positioned on the rear surface, the front surface, or a side surface of the mobile terminal 500. While the button 600 is positioned on the rear surface of the mobile terminal 500 in the embodiment illustrated in FIG. 2, the button 600 may be located on the front surface of the mobile terminal 500. The button 600, which is positioned on the rear surface of the mobile terminal 500, may be exposed through a button hole 502*a* formed on a rear case 502 or a rear cover. The button 600, which is positioned on the front surface of the mobile terminal 500, may be exposed through a button hole formed on a glass 551*a*. The following description is given with the appreciation that a case with the button hole formed thereon also includes the glass 551*a*.

For security of the mobile terminal 500, a fingerprint recognition module 611 may be used. The fingerprint recognition module 611 may be used for unlocking so that only when user information sensed by the fingerprint recognition module 611 matches, the mobile terminal 500 may be used, or for accessing information required for security, such as payment information or the like.

Although the fingerprint recognition module 611 may be implemented in a part of the case 502 or 551*a* of the mobile terminal 500, the fingerprint recognition module 611 may degrade the neat appearance of the mobile terminal 500 because the part in which the fingerprint recognition module 611 is located and the case 502 or 551*a* are formed of different materials. Therefore, the degradation of the appearance may be prevented by implementing the fingerprint recognition module 611 in the button 600 configured as a separate part from the case.

A button located on a side surface of the mobile terminal 500 is small in size, thereby making it difficult to implement the fingerprint recognition module 611 in the button. Therefore, the fingerprint recognition module 611 may be implemented in the home button 600 positioned on the front or rear surface of the mobile terminal 500. As the home button 600 is generally implemented in a physical key mechanism, the home button 600 is configured as a separate part from the case 502 or 551*a*, and its large size may provide a sufficient area for identifying a user's fingerprint.

As the mobile terminal 500 has recently been equipped with increasing functions, the mobile terminal 500 is often used in an environment with water, such as a swimming pool or a bathroom. Thus, the demand for the mobile terminal 500 with a waterproof function has been rising. It is very important to prevent the intrusion of water into various holes formed in the mobile terminal 500.

For example, an audio hole through which sound is output may be formed of a Gore-Tex material that repels water, while allowing air to pass therethrough. Although there is also a need for a waterproof structure that prevents the intrusion of water between the button hole 502*a* and the button 600 formed on the case 502 or 551a, the button 600 moves upon being pressed by the user, and thus a structure for preventing the intrusion of water in spite of the movement of the button 600 is required.

Figure 14:
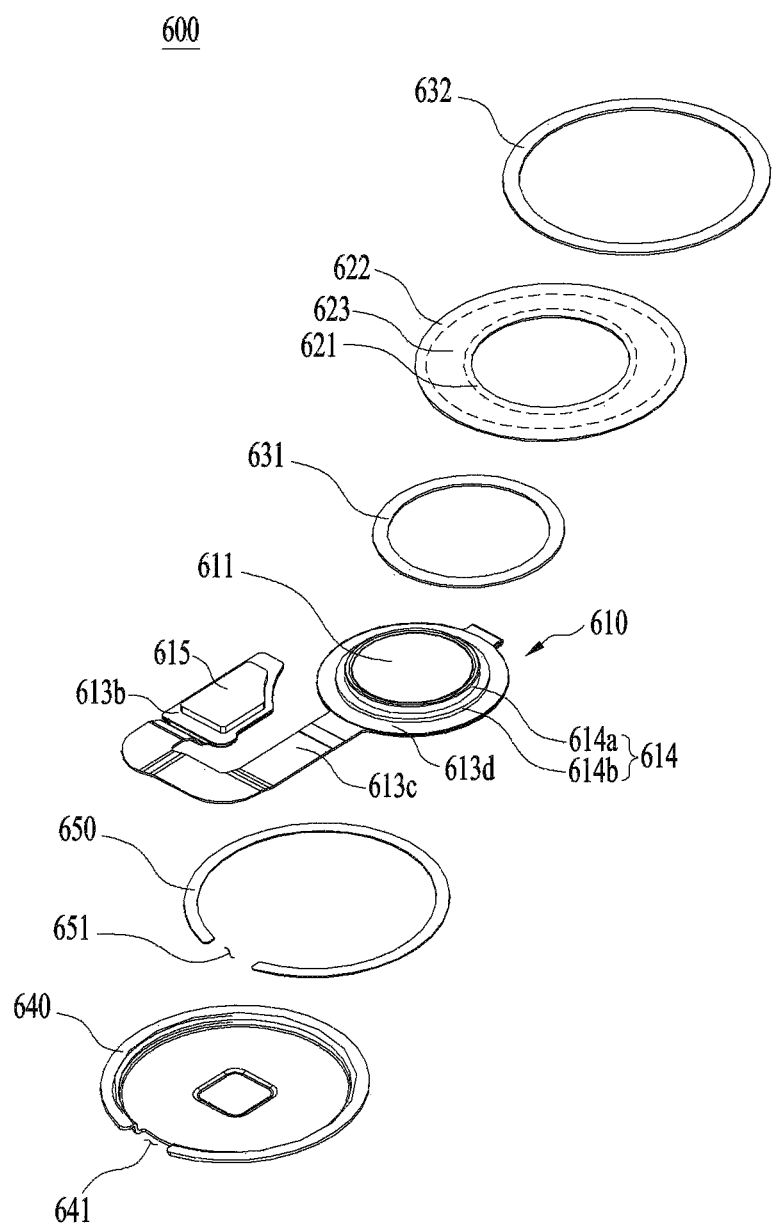
FIG. 14 is a view illustrating a button module, a sealing rubber, a first waterproof tape, a second waterproof tape, a bracket tape, and a button bracket in the mobile terminal related to the present disclosure.

FIG. 14 is an enlarged view illustrating the structure of the button 600 according to the present disclosure. The button 600 of the present disclosure includes a button module 610 with the fingerprint recognition module 611 and a switch 612, a sealing rubber 620 surrounding the button module 610, a first waterproof tape 631 disposed between the sealing rubber 620 and the button module 610, and a second waterproof tape 632 disposed between the sealing rubber 620 and the case 502 or 551a.

The button module 610 includes the switch 612 that generates a signal, when the user presses the button module 610, and the fingerprint recognition module 611 that recognizes a fingerprint. Since the user should directly contact the fingerprint recognition module 610, the fingerprint recognition module 610 is exposed to the outside through the button hole 502a formed on the case 502 or 551a. Although the conventional button module 610 has only to be provided with the switch 612, more space is required to adopt both the switch 612 and the fingerprint recognition module 610.

Figure 15:
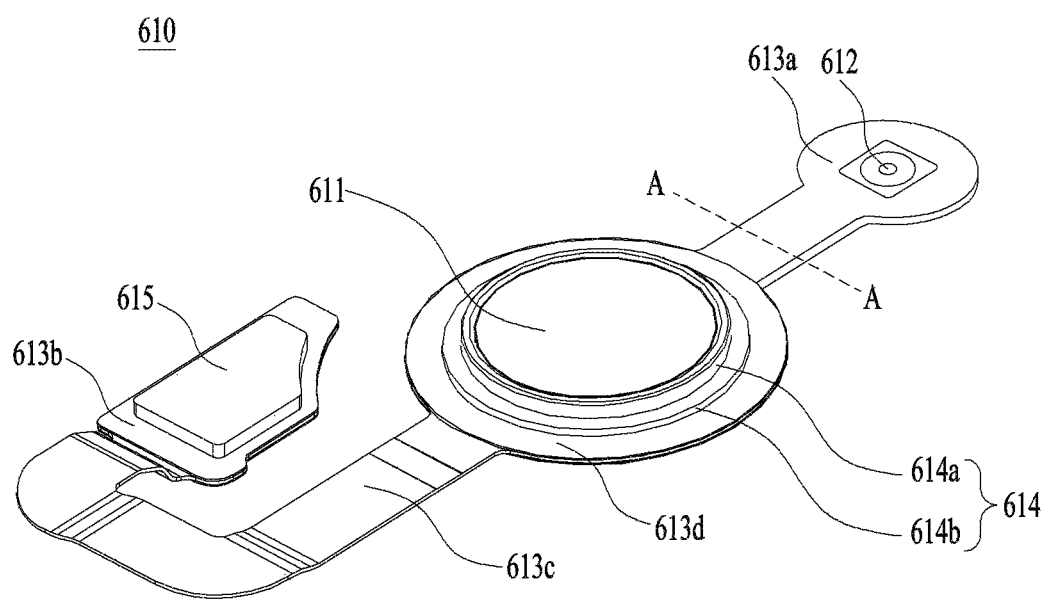
FIG. 15 is a plan view illustrating the front and rear surfaces of the button module in the mobile terminal related to the present disclosure.

FIG. 15 is a plan view of the front and rear surfaces of the button module 610 in the mobile terminal 500 related to the present disclosure. In this embodiment, the button module 610 includes a flexible board 613, the fingerprint recognition module 611, the switch 612, a contact terminal 615, and a button frame 614.

Both of the fingerprint recognition module 611 and the switch 612 should be arranged in the button hole 502a, in parallel with each other in an inward direction of the case 502 or 551a. Thus, the fingerprint recognition module 611 and the switch 612 may be formed respectively on one and the other surfaces of the flexible board 613. However, the circuit should be configured in two layers, making the flexible board 613 thick. Therefore, as illustrated in FIG. 15, after both of the switch 612 and the fingerprint recognition module 611 are mounted on one surface of the flexible board 613, the flexible board 613 is folded along line A-A so that the fingerprint recognition module 611 may be superimposed on the switch 612.

The arrangement of the switch 612 and the fingerprint recognition module 611 on one surface of the flexible board 613 and then the folding of the arranged switch 612 and fingerprint recognition module 611 enable the two parts to be mounted at one time, obviating the need for twice performing an SMT operation of mounting a part on the flexible board 613. As a consequence, the number of fabrication processes is reduced.

The fingerprint recognition module 611 includes a fingerprint sensor mounted on the flexible board 613, and an epoxy portion covering the top of the fingerprint sensor. The epoxy portion is exposed outward through the button hole 502a, and the exterior of the epoxy portion and the case 502 or 551a may look uniform by coating glass or a color on the epoxy portion. The fingerprint recognition module 611 is formed in correspondence with the shape of the button hole 502a. As illustrated in FIG. 14, the fingerprint recognition module 611 may be circular. However, the shape of the fingerprint recognition module 611 is not limited to any particular shape, and thus may be square, oval, or the like.

The button frame 614 may further be provided around the fingerprint recognition module 611. The button frame 614 includes an outer body portion 614a surrounding the fingerprint recognition module 611, and a flange 614b extending outward from the outer body portion 614a.

The outer body portion 614a is exposed to the outside along with the fingerprint recognition module 611 through the button hole 502a. Since the outer body portion 614a contacts the periphery of the button hole 502a, the outer body portion 614a has a shape and a size corresponding to the shape of the button hole 502a. The flange 614b extending outward from the outer body portion 614a covers internal parts so that the internal parts may not be seen through the gap between the button hole 502a and the outer body portion 614a, and prevents slip-off of the button module 610 from the button hole 502a.

The button frame 614 may be formed of a metal. If the button frame 614 is formed of a metal, external static electricity applied to the fingerprint recognition module 611 may be induced to the button frame 614. The resulting improvement of electrostatic discharge (ESD) may prevent the static electricity from doing damage to the fingerprint recognition module 611, which will be described later in greater detail.

The flexible board 613 includes a mounting portion 613a on which the switch 612 and the fingerprint recognition module 611 are mounted, a contact portion 613b that contacts a main board, and a connection portion 613c that connects the mounting portion 613a to the contact portion 613b. The mounting portion 613a may be formed to be smaller than the fingerprint recognition module 611. As illustrated in FIG. 15, the mounting portion 613a may be formed to be larger than the fingerprint recognition module 611, and thus may further include an extension portion 613d extending to the outside of the fingerprint recognition module 611.

The sealing rubber 620 has an opening formed thereon, in which a fingerprint recognition unit of the button module 610 is inserted, and is disposed around the fingerprint recognition unit. In this embodiment, since the fingerprint recognition module 611 is circular, the sealing rubber is ring-shaped. The sealing rubber 620 is provided, at a part close to the opening, with an engagement portion 621 that is engaged with the button module 610, and at the outermost part thereof, with the fixing portion 622 that is engaged with the case 502 or 551a. An elastic deformation portion 623, which is deformed, when the button module 610 is pressed and thus moves, is positioned between the engagement portion 621 and the fixing portion 622.

All of the fixing portion 622, the engagement portion 621, and the elastic deformation portion 623 may be formed of the same material in the same shape. The elastic deformation portion 623 may be formed of a more flexible material or in a different shape. The engagement portion 621 and the fixing portion 622 form a closed loop, the first waterproof tape 631 is engaged with the engagement portion 621, and the second waterproof tape 632 is engaged with the fixing portion 622.

The first waterproof tape 631 and the second waterproof tape 632 are positioned between the engagement portion 621 and the button module 610, and between the fixing portion 622 and the case 502 or 551a, forming a closed loop corresponding to the shapes of the engagement portion 621 and the fixing portion 622.

Figure 16:
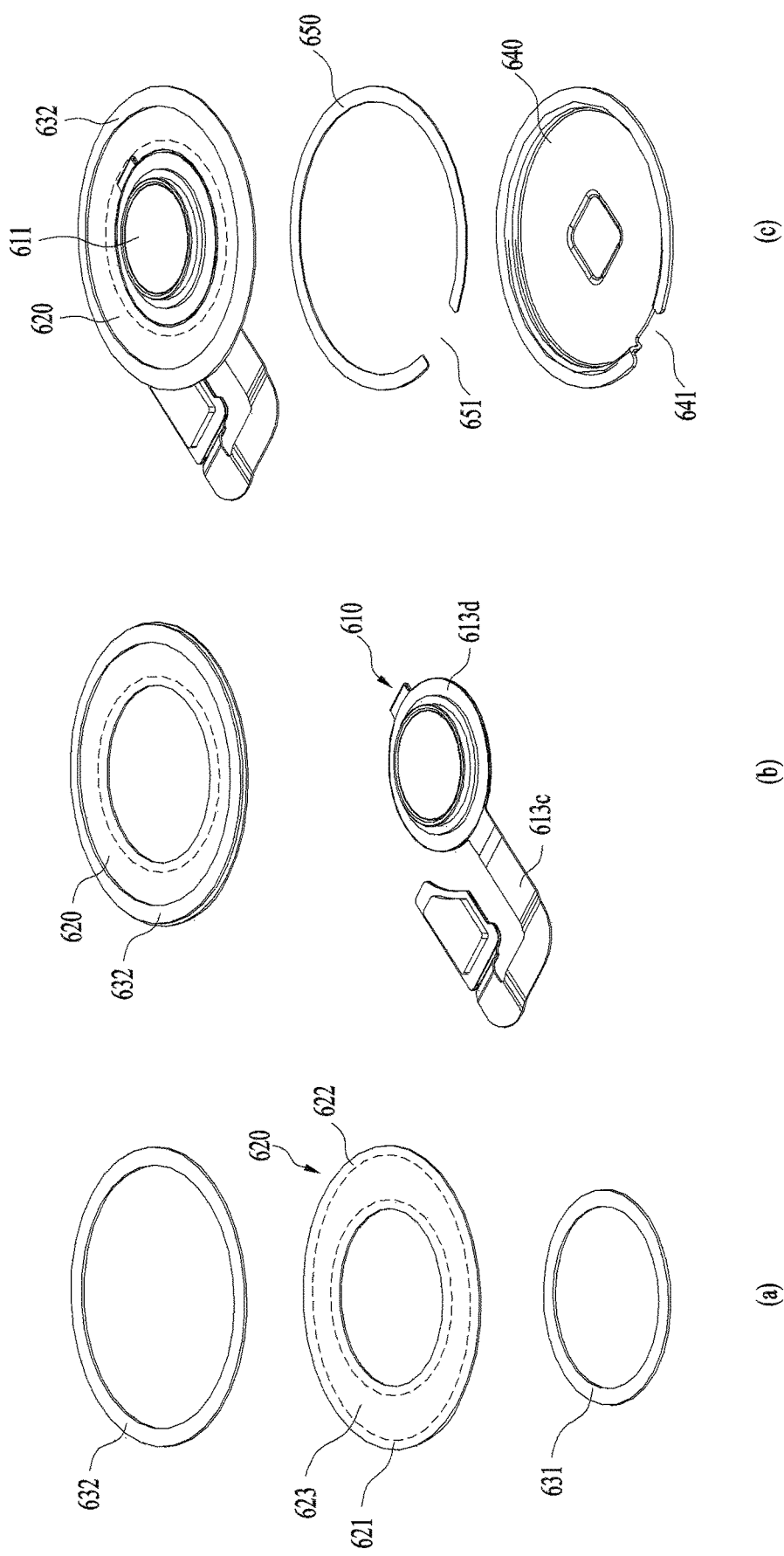
FIG. 16 is a view illustrating a process of assembling the button module, the sealing rubber, the first waterproof tape, the second waterproof tape, the bracket tape, and the button bracket in the mobile terminal related to the present disclosure.

FIG. 16 is a view illustrating a process of assembling the button module 610, the sealing rubber 620, the first waterproof tape 631, the second waterproof tape 632, a bracket tape 650, and a button bracket 640. Referring to (a), the first waterproof tape 631 is engaged with the bottom surface of the engagement portion 621 of the sealing rubber 620, and the second waterproof tape 632 is engaged with the top surface of the fixing portion 622 of the sealing rubber 620. (An outward direction from the button hole 502a is referred to as upward, up, or top, and a direction into the case 502 or 551*a* is referred to as downward, down, or bottom.)

Subsequently, as illustrated in (b), the button module 610 is engaged with the sealing rubber 620 by inserting the fingerprint recognition module 611 into the opening of the sealing rubber 620 from under the sealing rubber 620. The opening of the sealing rubber 620 matches to the shape of the fingerprint recognition module 611, and the extension portion 613*d* of the flexible board 613 is positioned under the sealing rubber 620. That is, the extension portion 613*d* is engaged with the first waterproof tape 631, thereby being in waterproof engagement with the sealing rubber 620.

Conventionally, a waterproof tape engaged with the flexible board 613 is disposed around the mounting portion 613*a*, partially overlapping with the connection portion 613*c* of the flexible board 613. That is, as the front surface of the waterproof tape is only partially engaged with the connection portion 613*c* of the flexible board 613, not fully with the flexible board 613, a gap is produced between a part overlapped with the flexible board 613 and a non-overlapped part.

In the present disclosure, the extension portion 613*d* of the flexible board 613, the engagement portion 621 of the sealing rubber 620, and the first waterproof tape 631 are formed in the same shape. Therefore, once the entire top surface of the first waterproof tape 631 is engaged with the sealing rubber 620, the first waterproof tape 631 is fully engaged with the extension portion 613*d* of the flexible board 613. The resulting absence of a gap may lead to the reliability of waterproof performance.

While the assembly of the sealing rubber 620 and the button module 610 may be attached inside the button hole 502*a* of the case 502 or 551*a*, the button bracket 640 may further be provided such that the sealing rubber 620 is firmly fixed, and when the button module 610 is pressed, the switch 612 is accurately pressed and thus generates a signal. (c) illustrates engagement between the assembly of the sealing rubber 620 and the button module 610 and the button bracket 640, in which the button bracket 640 may be formed in the shape of a dish with its periphery protruding upward and its center sunken.

To engage the button bracket 640 with the sealing rubber 620, the bracket tape 650 may be used. The bracket tape 650 may be disposed in correspondence with the protruding portion of the button bracket 640. Since the bracket tape 650 does not execute the waterproof function, it does not matter that one part of the bracket tape 650 is open. Thus, a part which the connection portion 613*c* of the flexible board 613 crosses may be opened. To prevent an increase in the thickness of an overlapped part of the button bracket 640, the button bracket 640 may also be formed into an open loop with a part opened as indicated by reference numeral 641, as illustrated in FIG. 16.

The bracket tape 650 may be positioned at the fixing portion 622 of the sealing rubber 620. Since the fixing portion 622 is fixed to the case 502 and thus remains still, the button bracket 640 may be fixed to the case 502, not to be moved, and when the user presses the button 600, the switch 612 may be pressed.

Figure 17:
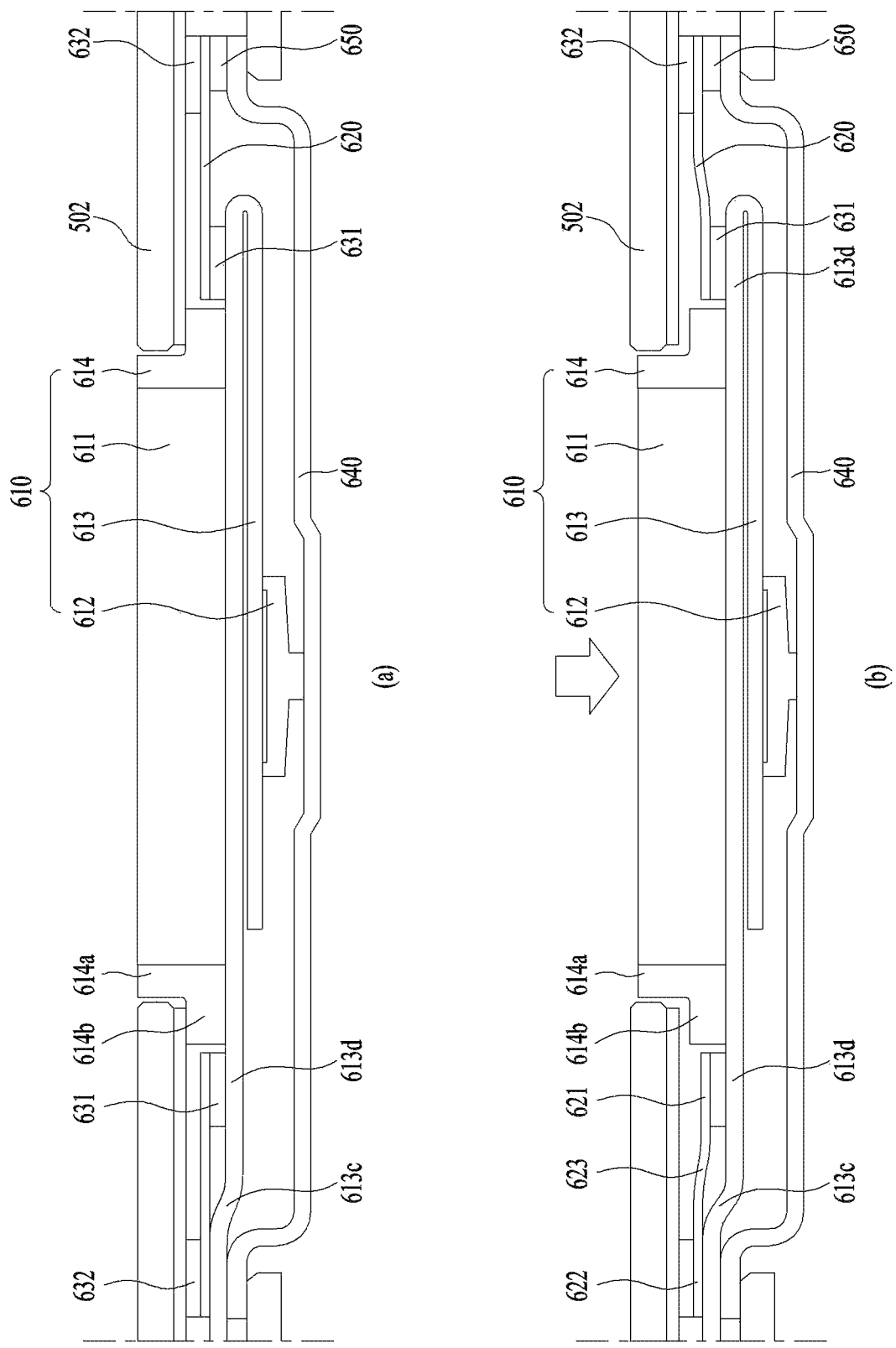
FIG. 17 is a sectional view illustrating the button module in the mobile terminal related to the present disclosure.

FIG. 17 is a sectional view illustrating the button module 610 in the mobile terminal 500 related to the present disclosure. (a) of FIG. 17 illustrates the button module 610 in a normal state, and (b) of FIG. 17 illustrates the button module 610, when it is pressed by a user.

Before the user applies force to the button module 610, the switch 612 is not pressed, while the sealing rubber 620 supports the button module 610. On the other hand, when the user presses the button module 610, the switch 612 is pressed, and the elastic deformation portion 623 of the sealing rubber 620 is deformed, while the button module 610 moves down.

Figure 18:
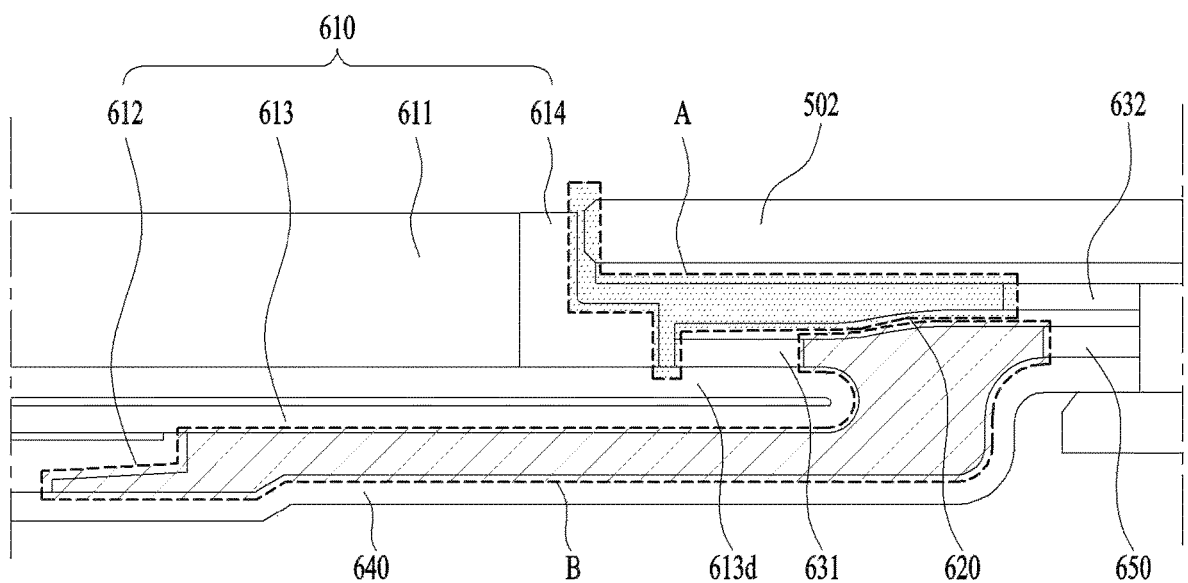
FIG. 18 is a view illustrating a waterlogging area and a waterproof area in the embodiment of FIG. 17.

FIG. 18 is a view illustrating a waterlogging area A and a waterproof area B in the embodiment of FIG. 17. Since one surface of the first waterproof tape 631 and a contact surface of the flexible board 613, and the other surface of the first waterproof tape 631 and a contact surface of the sealing rubber 620 form a closed loop, there is no gap, thereby causing no water leakage. Further, one surface of the second waterproof tape 632 and a contact surface of the sealing rubber 620, and the other surface of the second waterproof tape 632 and a contact surface of the case 502 or 551*a* also form a closed loop. The resulting absence of any gap leads to no water leakage.

That is, water may be introduced in the outside of the case 502 or 551*a*, the sealing rubber 620, and the button module 610 (the flexible board 613) (the water logging area in an upper part of FIG. 18), whereas water may not be introduced inside of the case 502 or 551*a*, the sealing rubber 620, and the button module 610 (the waterproof area in a lower part of FIG. 18), thus protecting internal parts. Since there is no step on a contact surface between a waterproof tape and another member, a gap is not generated, thereby increasing waterproof reliability.

Figure 19:
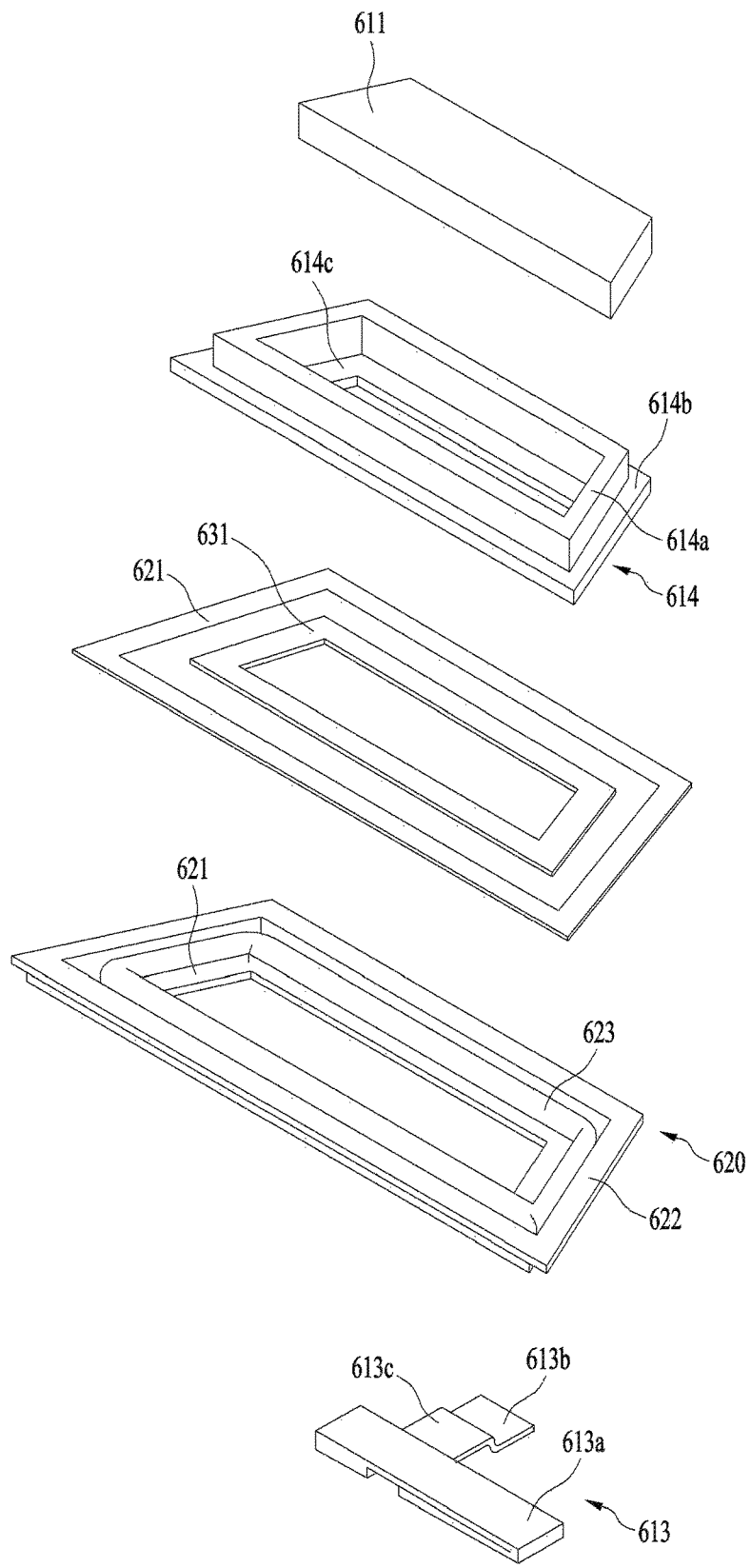
FIG. 19 is an exploded perspective view illustrating another embodiment of the button module, the sealing rubber, the first waterproof tape, and the second waterproof tape in the mobile terminal related to the present disclosure.

FIG. 19 is an exploded perspective view illustrating another embodiment of the button module 610, the sealing rubber 620, the first waterproof tape 631, and the second waterproof tape 632 in the mobile terminal 500 related to the present disclosure, and FIG. 9 is a sectional view of an assembly of the components illustrated in FIG. 19.

Figure 20:
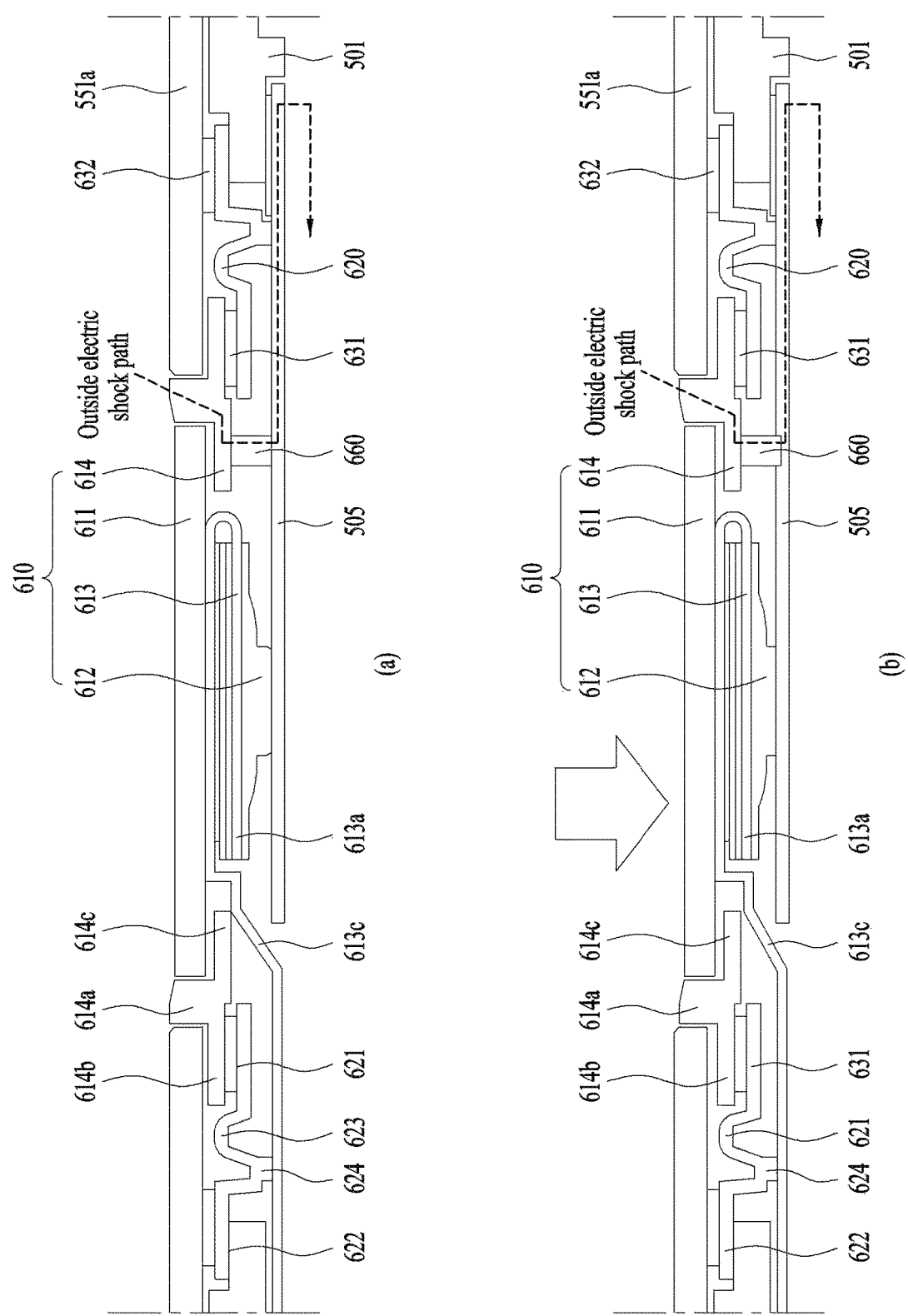
FIG. 20 is a sectional view illustrating an assembly of the components illustrated in FIG. 19.

In this embodiment, the flexible board 613 does not have a flexible portion, and the fingerprint recognition module 611 protrudes further than the flexible board 613. The first waterproof tape 631 is engaged with the button frame 614, instead of the flexible board 613. Referring to FIG. 20, the first waterproof tape 631 may be disposed further inward in the case 502 or 551*a* than the button frame 614. In this embodiment, the first waterproof tape 631 and the second waterproof tape 632 are positioned on the same surface of the sealing rubber 620.

If the first waterproof tape 631 and the second waterproof tape 632 are attached onto different surfaces of the sealing rubber 620 as in the foregoing embodiment, the sealing rubber 620 and the first waterproof tape 631 are positioned between the flange 614*b* of the button frame 614 and the case 502 or 551*a*. Due to a tolerance caused by the sealing rubber 620 and the first waterproof tape 631, the button module 610 exposed to the outside through the button hole 502*a* may be disposed inclined. Therefore, the first waterproof tape 631 is disposed further inward than the flange 614*b* of the button frame 614 in this embodiment.

In the sealing rubber 620 of this embodiment, the engagement portion 621 and the fixing portion 622 are formed flat so as to be brought into close contact with the first waterproof tape 631 and the second waterproof tape 632, whereas the elastic deformation portion 623 is formed to have a curved surface so that when the user presses the button 600, the elastic deformation portion 623 is bent to a variable extent. Compared to the foregoing embodiment, the sealing rubber 620 of this embodiment may further include a support 624, thereby preventing the button module 610 from hanging downward. The support 624 of the sealing rubber 620 may allow the switch 612 of the button 600 to generate a signal only when the user presses the button 600, thereby increasing reliability.

This embodiment improves ESD performance by blocking static electricity applied to the button module 610 from being transferred to the fingerprint recognizer and the switch 612. As described before, as the button module 610 is provided with the button frame 614 formed of a metal, static electricity applied to the button module 610 is transferred to a metal reinforcement frame 505 inside the mobile terminal 500 through the button frame 614. As a consequence, damage to the switch 612 and the fingerprint recognition module 611 may be prevented, which might otherwise be caused by the static electricity.

The reinforcement frame 505 is positioned on the rear surface of the display unit 551, supports the display unit 551, and ensures the strength of the mobile terminal 500. As the reinforcement frame 505 contains a metal, it acts as a ground for the mobile terminal 500.

A conductive gasket 660 that electrically connects between the reinforcement frame 505 and the button frame 614 may contain a conductive material, and have elasticity. Thus, when the button module 610 is pressed, the conductive gasket 660 may be changed in its shape accordingly. As illustrated in FIG. 20, static electricity applied from the outside is transferred to the reinforcement frame 505 through the button frame 614 and the conductive gasket 660.

As described above, since the gaps between the flexible board 613 and the waterproof members are eliminated in the button 600 of the mobile terminal 500, the intrusion of water through the button hole 502a may be prevented. Further, application of a new waterproof structure may enable fabrication of the mobile terminal 500 to be slimmer than in the conventional technology.

Further, the new waterproof structure is formed of rubber. Therefore, a stroke space may advantageously be secured for the home button 600 of the mobile terminal 500.

The above detailed description should not be construed as being limitative in all terms, but should be considered as being illustrative. The scope of the present disclosure should be determined by reasonable analysis of the accompanying claims, and all changes in the equivalent range of the present disclosure are included in the scope of the present disclosure.

The invention claimed is:

1. A mobile terminal including a frame and a window disposed on a top surface of the frame, the mobile terminal comprising:
   a fingerprint recognition module;
   a home button having an accommodation space formed therein, the accommodation space being configured to accommodate the fingerprint recognition module therein; and
   a sealing rubber sealing between the window and the home button,
   wherein the home button comprises:
      an outer body portion surrounding the fingerprint recognition module; and
      a spacer formed in the outer body portion, and spacing the sealing rubber from the fingerprint recognition module,
   wherein the sealing rubber comprises:
      a fixing portion disposed between the frame and the window; and
      a mounting portion extending from the fixing portion, and configured to mount the home button therein, and
   wherein a first adhesive member is disposed between the fingerprint recognition module and the spacer, and a second adhesive member is disposed between the mounting portion and the spacer.

2. The mobile terminal according to claim 1, wherein at least one of the spacer or the mounting portion is formed along a periphery of the outer body portion.

3. The mobile terminal according to claim 1, wherein the fingerprint recognition module comprises a board portion and a touch portion disposed on the board portion and configured to touch a fingerprint, and
   wherein the first adhesive member is disposed between the board portion and the spacer portion, a hole exposing a bottom surface of the board portion is formed on the home button, and an opening facing the hole is formed in the sealing rubber.

4. The mobile terminal according to claim 3, further comprising:
   a dome switch under the board portion; and
   a flexible printed circuit board (FPCB) connecting the bottom surface of the board portion exposed through the hole and the opening to the dome switch.

5. The mobile terminal according to claim 1, further comprising a second button positioned on one side of the home button,
   wherein the sealing rubber comprises a second mounting portion formed between the fixing portion and the mounting portion, and configured to mount the second button therein, and
   wherein a fourth adhesive member is disposed between the second mounting portion and the second button.

6. The mobile terminal according to claim 5, wherein a second opening exposing a bottom of the second button is formed on the sealing rubber, and the bottom of the second button exposed through the second opening is connected to a second dome switch.

7. The mobile terminal according to claim 5, further comprising a third button positioned on the other side of the home button,
   wherein the sealing rubber comprises a third mounting portion formed between the fixing portion and the mounting portion, and configured to mount the third button therein, and
   wherein a fifth adhesive member is disposed between the third mounting portion and the third button.

8. The mobile terminal according to claim 7, wherein a third opening exposing a bottom of the third button is formed on the sealing rubber, and the bottom of the third button exposed through the third opening is connected to a third dome switch.

9. A mobile terminal including a frame and a window disposed on a top surface of the frame, the mobile terminal comprising:
   a fingerprint recognition module;
   a home button having an accommodation space formed therein, the accommodation space being configured to accommodate the fingerprint recognition module therein; and
   a sealing rubber sealing between the window and the home button,
   wherein the home button comprises:
      an outer body portion surrounding the fingerprint recognition module;
      a spacer formed in the outer body portion, and spacing the sealing rubber from the fingerprint recognition module; and
      a flange formed along an outer periphery of the outer body portion, wherein the sealing rubber comprises:
- a fixing portion disposed between the frame and the window;
- a mounting portion extending from the fixing portion, and configured to mount the home button thereon; and
- an elastic deformation portion connecting the fixing portion to the mounting portion, wherein a first adhesive member is disposed between the fingerprint recognition module and the spacer, and a second adhesive member is disposed between the mounting portion and the spacer, and wherein when the home button moves downward, the elastic deformation portion applies restoring force to the home button.

10. A mobile terminal comprising:
a case comprising a button hole;
a main board mounted inside the case;
a button module exposed to an outside through the button hole;
a sealing rubber comprising an opening configured to allow the button module to be inserted therethrough;
a first waterproof tape in the form of a closed loop, configured to engage the sealing rubber with the button module; and
a second waterproof tape in the form of a closed loop, configured to engage the sealing rubber with the case,
wherein the button module comprises:
- a fingerprint recognition module configured to recognize a user's fingerprint, when the fingerprint recognition module is touched by the user's finger;
- a switch configured to generate a signal, when pressed; and
- a flexible board comprising a mounting portion configured to mount the fingerprint recognition module and the switch thereon, a contact portion contacting the main board, and a connection portion connecting the mounting portion to the contact portion, and wherein the sealing rubber comprises:
- a fixing portion engaged with the case by the second waterproof tape;
- an engagement portion extending from the fixing portion, and engaged with the button module by the first waterproof tape; and
- an elastic deformation portion disposed between the fixing portion and the engagement portion, and having a variable shape.

11. The mobile terminal according to claim 10, wherein the fingerprint recognition module and the switch are positioned on the same surface of the mounting portion, and the flexible board is bent to superimpose the fingerprint recognition module and the switch over each other.

12. The mobile terminal according to claim 10, wherein the flexible board further comprises an extension portion extending outward from a periphery of the fingerprint recognition module, and
wherein the first waterproof tape corresponds to a shape of the extension portion, and is engaged with the extension portion.

13. The mobile terminal according to claim 10, wherein a metal button frame having an accommodation space formed therein is included, the accommodation space being configured to accommodate the fingerprint recognition module therein.

14. The mobile terminal according to claim 13, further comprising:
a reinforcement frame disposed inside the case; and
a conductive gasket connecting between the button frame and the reinforcement frame.

15. The mobile terminal according to claim 13, wherein the button frame comprises:
- an outer body portion surrounding the fingerprint recognition module, and contacting a periphery of the button hole;
- a flange extending outward along an outer periphery of the outer body portion, and contacting an inside of the case; and
- a spacer extending inward in the outer body portion, and supporting a periphery of a bottom surface of the fingerprint recognition module.

16. The mobile terminal according to claim 10, further comprising a button bracket mounted inside the case, and supporting the sealing rubber and the button module,
wherein a bracket tape fixing the sealing rubber and the button bracket to each other is included, and
wherein the bracket tape and the second waterproof tape are disposed on opposite surfaces of the sealing rubber, opposing to each other.

17. The mobile terminal according to claim 16, wherein the bracket tape is in the form of an open curve with a part opened, to allow the connection portion of the flexible board to pass therethrough.

18. The mobile terminal according to claim 10, wherein the fixing portion and the engagement portion of the sealing rubber are flat, and the elastic deformation portion of the sealing rubber has a curved surface.

19. The mobile terminal according to claim 10, further comprising a support disposed between the elastic deformation portion and the fixing portion, and supporting the sealing rubber to an internal structure of the mobile terminal.

* * * * *